United States Patent
Nakaya et al.

(10) Patent No.: US 7,050,716 B2
(45) Date of Patent: *May 23, 2006

(54) EXPOSURE DEVICE

(75) Inventors: Daisuke Nakaya, Kanagawa (JP); Takeshi Fujii, Kanagawa (JP); Yoshimitsu Kudoh, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/009,028

(22) Filed: Dec. 13, 2004

(65) Prior Publication Data
US 2005/0083502 A1 Apr. 21, 2005

Related U.S. Application Data

(63) Continuation of application No. 10/456,680, filed on Jun. 9, 2003, now Pat. No. 6,832,045.

(30) Foreign Application Priority Data
Jun. 7, 2002 (JP) ............................. 2002-167411

(51) Int. Cl.
G03B 41/00 (2006.01)
(52) U.S. Cl. ..................... 396/548; 355/53; 382/151
(58) Field of Classification Search ................ 396/548; 382/151; 378/63, 205, 207; 355/53
See application file for complete search history.

(56) References Cited

U.S. PATENT DOCUMENTS

| 5,590,170 A | 12/1996 | Zweig |
| 6,552,352 B1 | 4/2003 | Momose et al. |
| 6,832,045 B1 * | 12/2004 | Nakaya et al. ............... 396/548 |
| 2001/0026638 A1 | 10/2001 | Sangu et al. |

FOREIGN PATENT DOCUMENTS

JP 2000-275863 A 10/2000

\* cited by examiner

*Primary Examiner*—Christopher Mahoney
(74) *Attorney, Agent, or Firm*—Sughrue Mion, PLLC

(57) ABSTRACT

In order to provide an exposure device by which aligning of an exposure pattern is realized when manufacturing a build up wiring board or the like, an exposure device which exposes a photosensitive material with a light beam modulated in accordance with image information comprising a reading section which reads a radioscopic image of a specific pattern provided on an inner layer of a laminated structure, and an aligning section which aligns an exposure position of the photosensitive material laminated on a surface of an outer layer of the laminated structure on the basis of the position information of the read radioscopic image of the specific pattern, is provided.

22 Claims, 20 Drawing Sheets

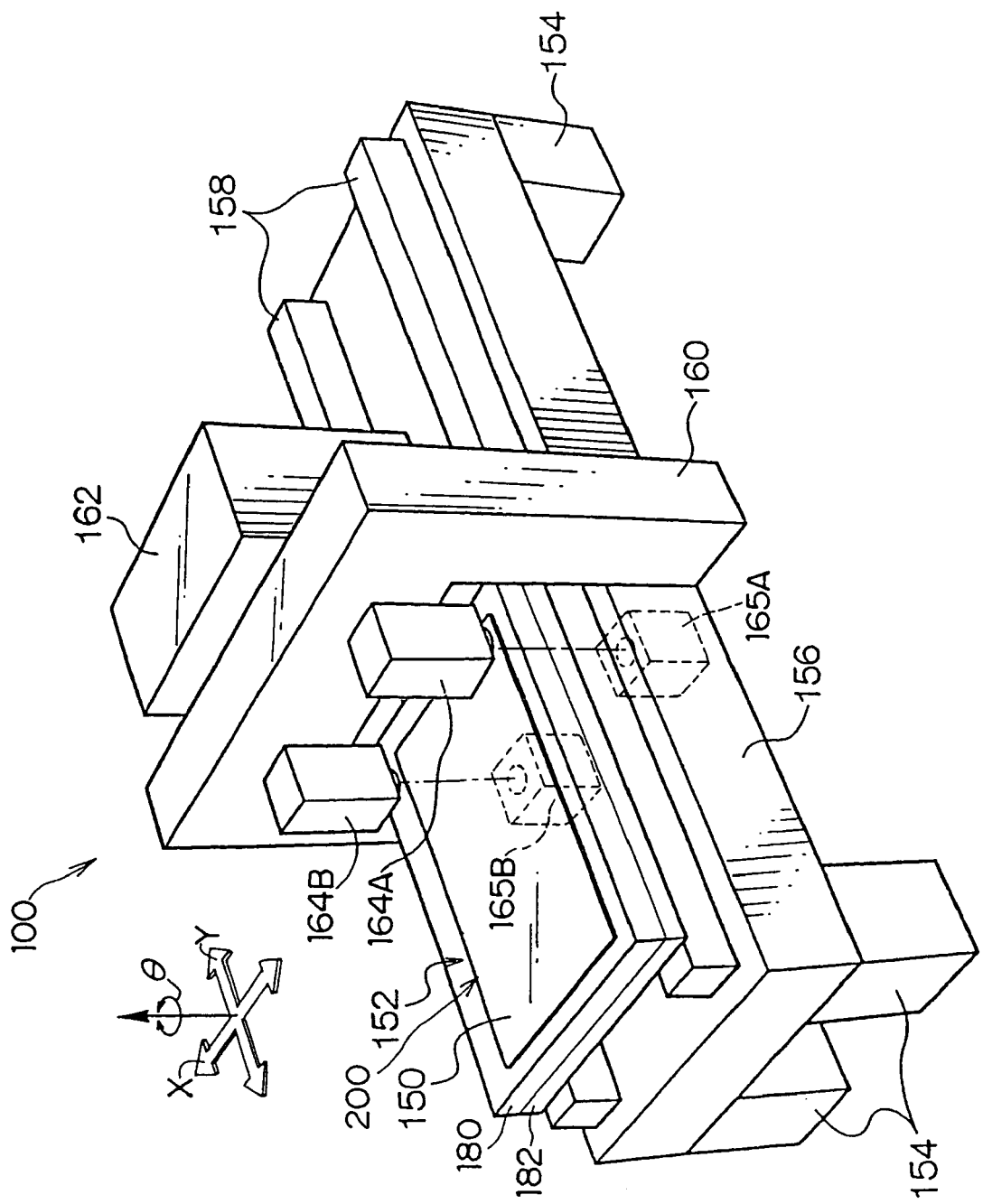

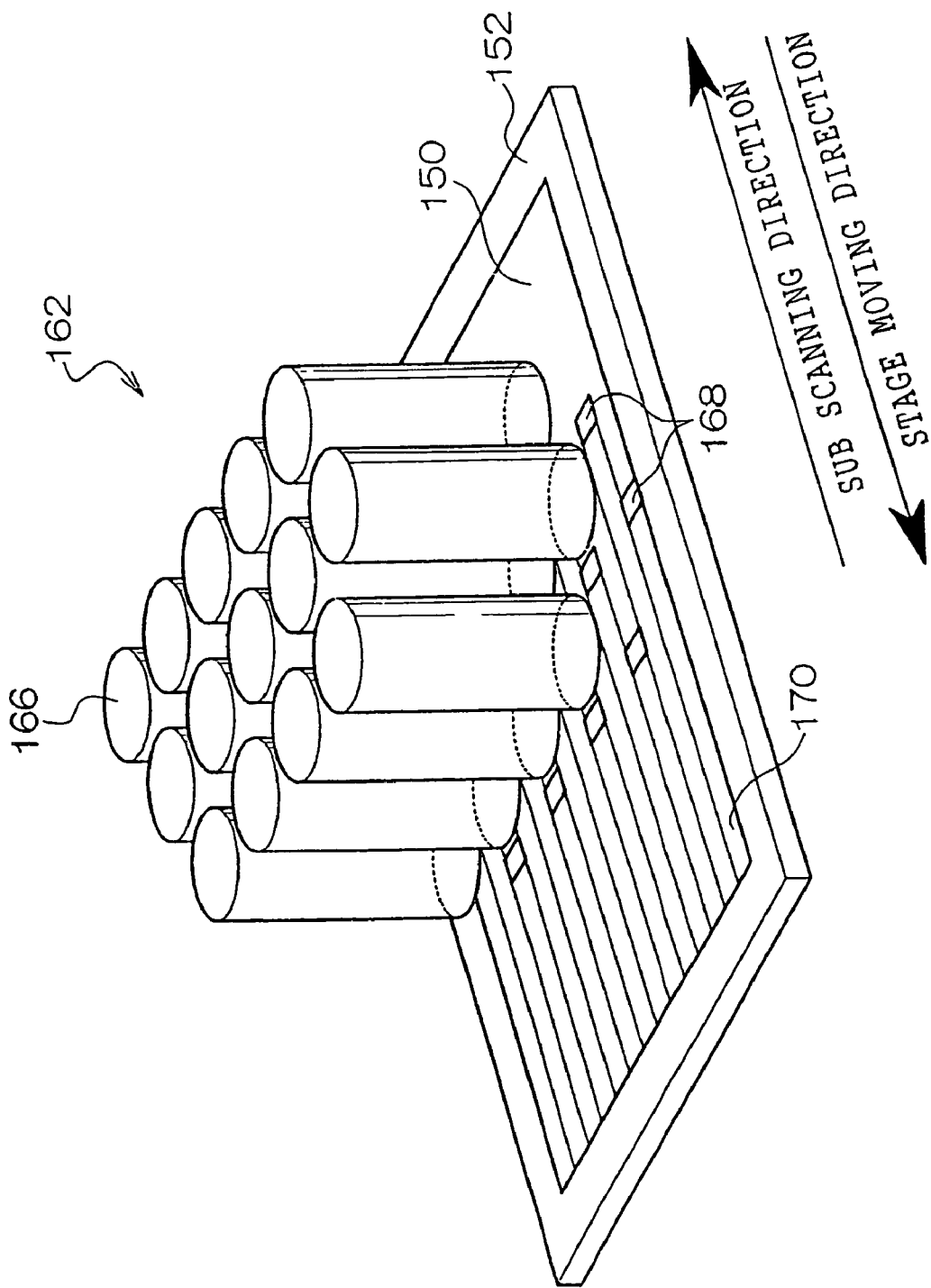

n COLUMNS

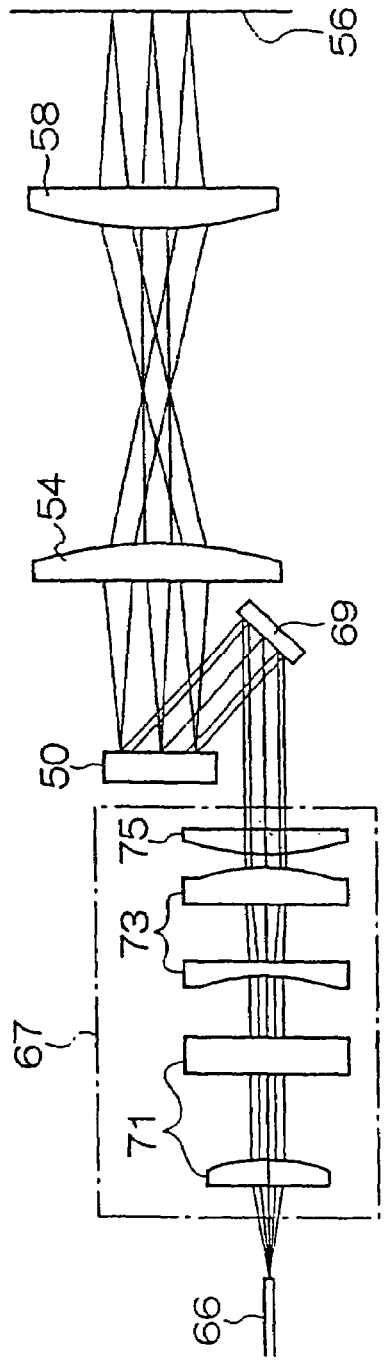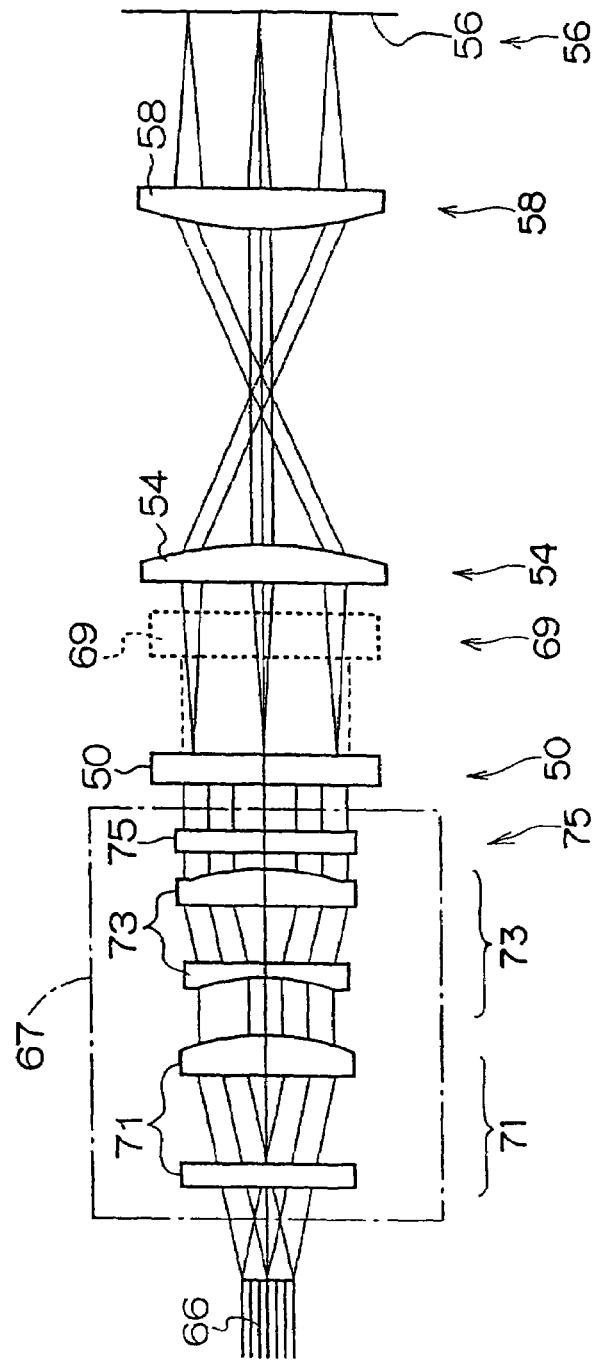
FIG. 5A
FIG. 5B

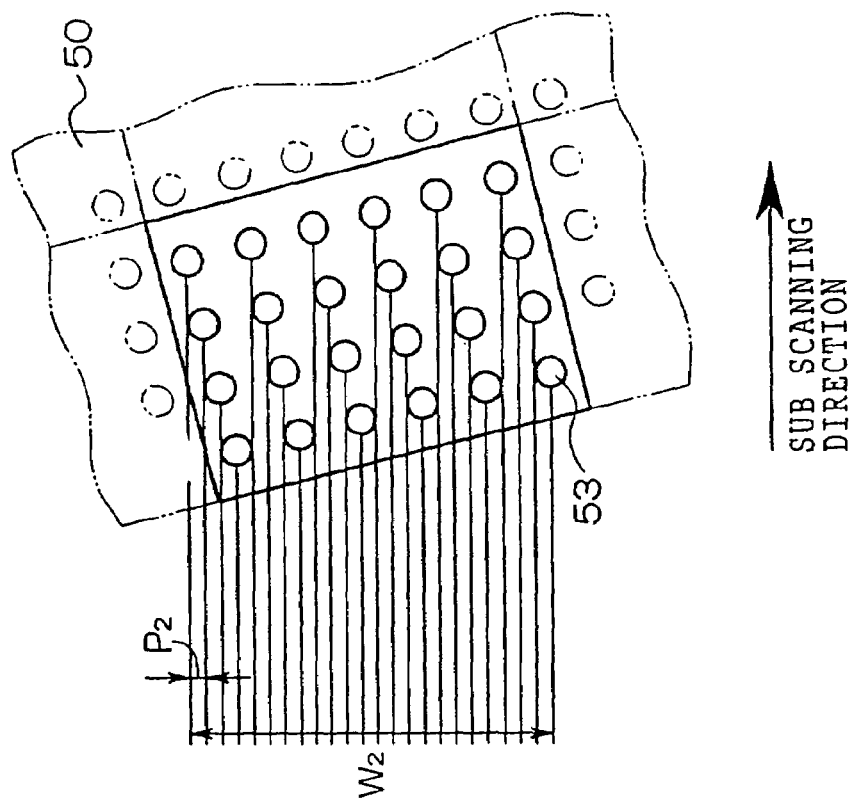
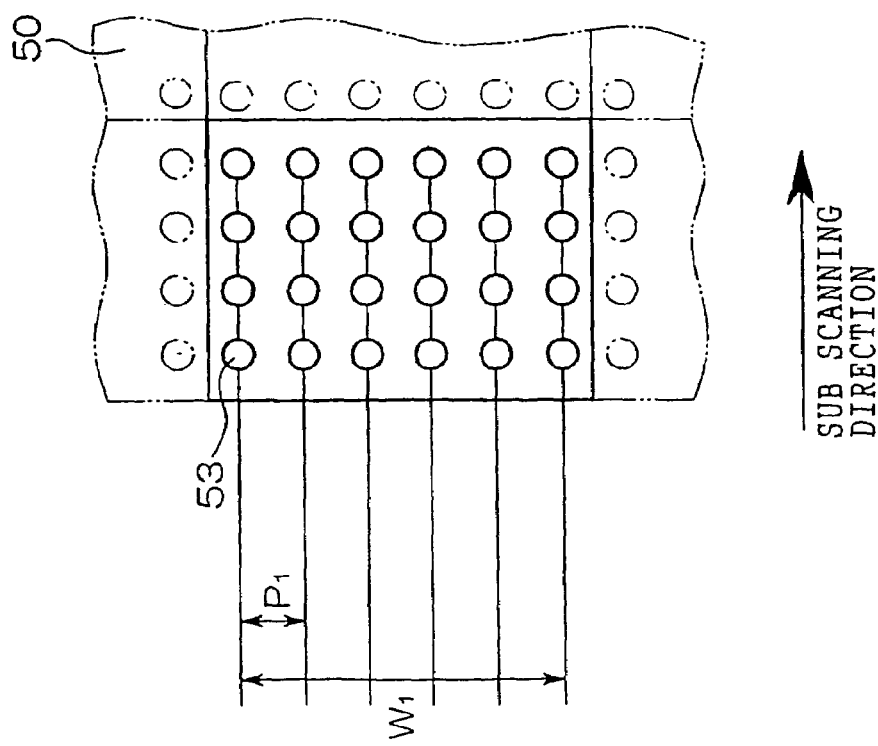

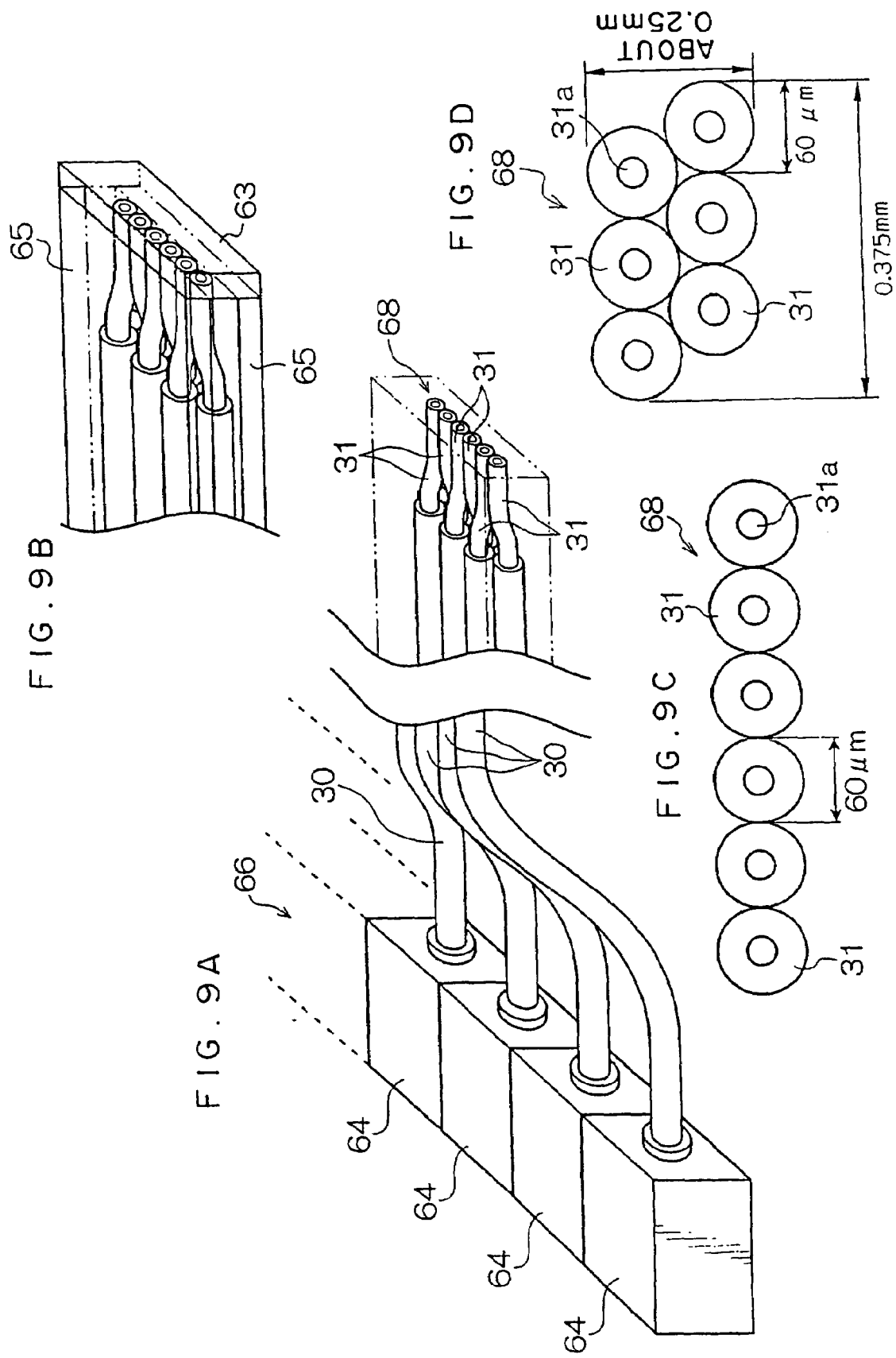

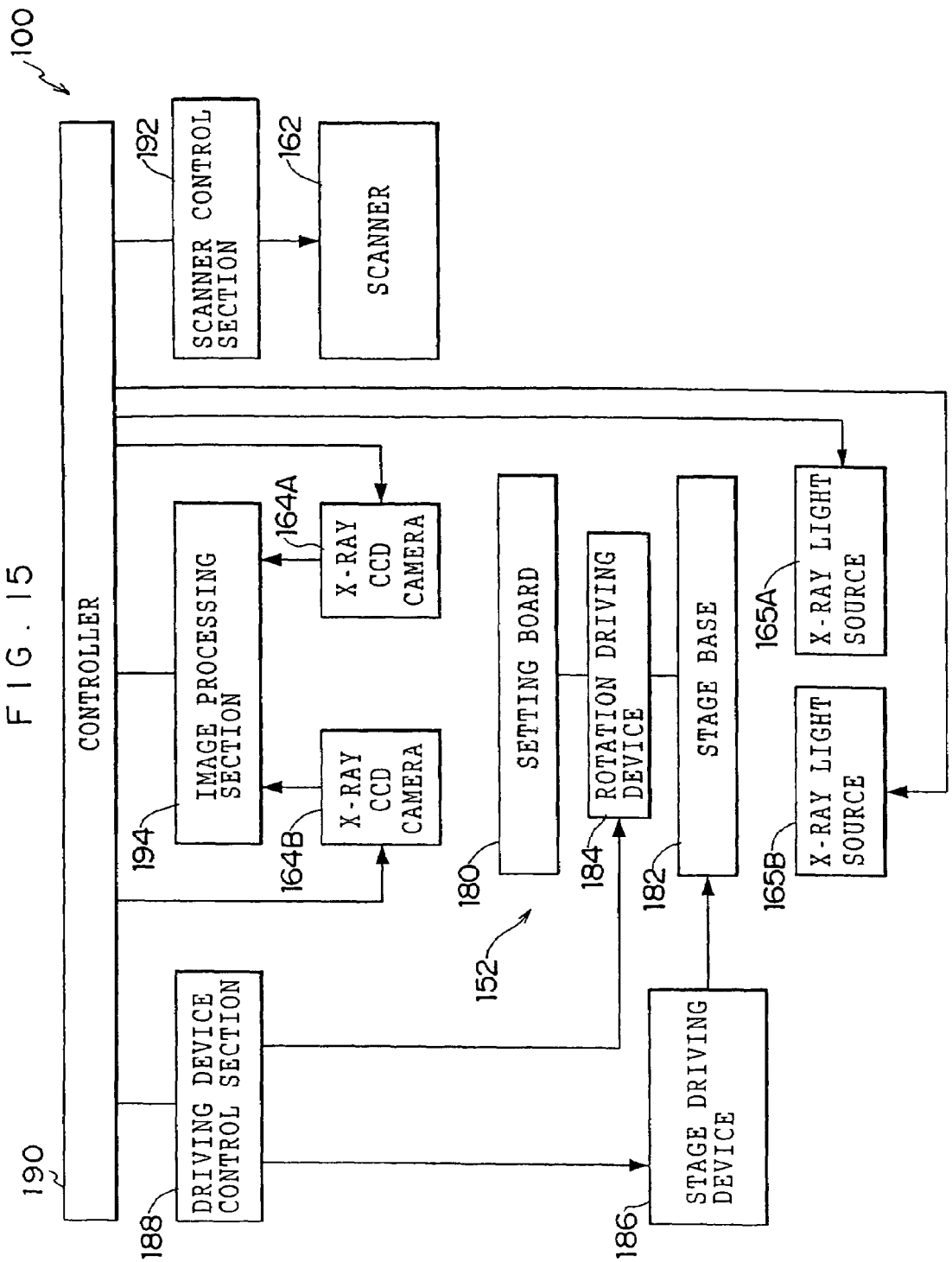

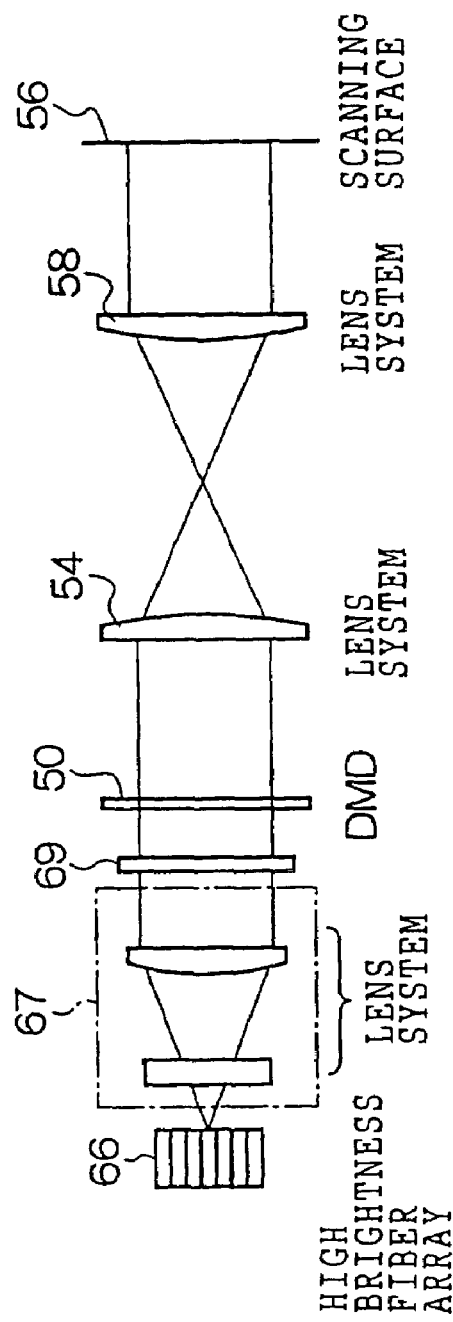
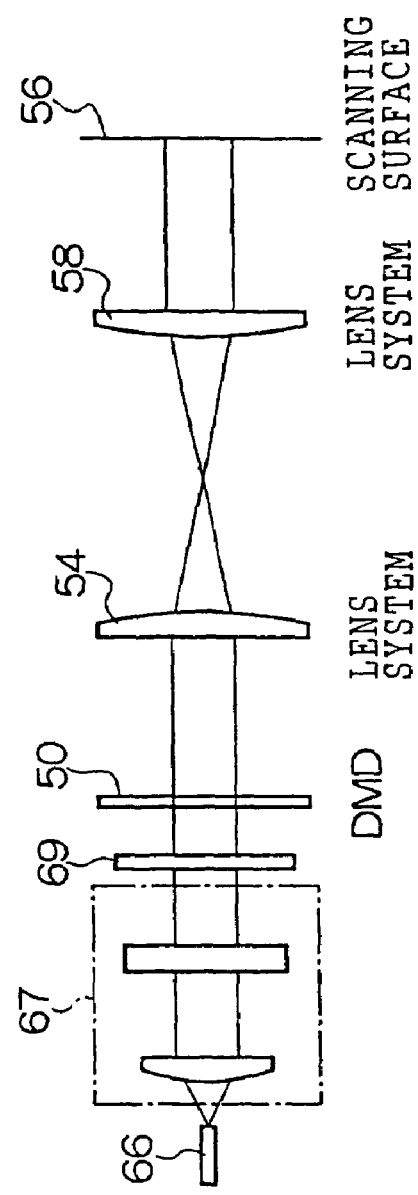
FIG. 17A
FIG. 17B

EXPOSURE DEVICE

CROSS-REFERENCE TO RELATED APPLICATION

This application is a continuation of U.S. patent application Ser. No. 10/456,680 filed on Jun. 9, 2003, now U.S. Pat. No. 6,832,045.

This application claims priority under 35 USC 119 from Japanese Patent Application No. 2002-167411, the disclosure of which is incorporated by reference herein.

BACKGROUND OF THE INVENTION

1. Field of the Invention

The present invention relates to an exposure device, and in particular, to an exposure device which exposes a photosensitive material with a light beam modulated by a space modulation element or the like in accordance with image information.

2. Description of the Related Art

Conventionally, various types of exposure devices, in which exposing is carried out with a light beam modulated by using a space modulation element such as a digital micro-mirror device (DMD) or the like in accordance with image data (image information), are proposed.

For example, the DMD is a mirror device in which many mirrors whose reflecting surface angle can be changed in accordance with control signal are arranged on a semiconductor substrate such as a silicon substrate or the like in two dimensional manner. A exposure device using the DMD has a light source, a (first) lens system, the DMD and a (second) lens system. The light source irradiates a laser light. The first lens system collimates the light beam irradiated from the light source. The DMD is disposed in a substantially focusing position of the first lens system. The light beam reflected at the DMD is image-formed by the second lens system on a scanning surface. The light beam is modulated by on-off controlling of each of the micro-mirrors of the DMD by the control signal generated in accordance with the image data or the like. Image exposure is carried out by the modulated laser light.

Such exposure device is used, for example, for exposing a photo resist which is used when manufacturing a printed wiring plate. As the result, many advantages are obtained such that cost for manufacturing and managing a photomask is reduced, a time required for trial manufacturing of a printed wiring board becomes shorter, change of design or the like of a circuit can be carried out easily and speedy, and the like. Recently, a build up wiring plate has been developed in order to respond to requirement for high density packaging. Using of the above mentioned exposure device when manufacturing the build up wiring plate has been investigated.

However, when manufacturing of the build up wiring board, an electric circuit (a wiring pattern) is formed on a surface of a build up layer laminated on a core substrate by an alignment mark (an inner via, a pattern, a pad or the like) provided at the core substrate (an inner layer substrate) being as a reference. Accordingly, the exposure device has a problem in an alignment (identification of the alignment mark and positioning (aligning) of an exposure pattern) which is carried out after the build up layer is laminated on the core substrate.

For example, such as a scanning type drawing equipment described in a Japanese Patent Laid-Open No. 2000-275863, when a pattern is recorded on a laminated material of a print wiring board or the like by means of a conventional device which directly exposes (records image) on a photo resist in a mask-less manner, an alignment mark such as a through hole or the like is detected by an image-pickuping device with a visible light, and a wiring patter formed on each layer is positioned (aligned). However, it is difficult to identify the alignment mark on the core substrate after building up (laminating) of the build up layer by such image-pickuping device using a visible light when manufacturing the build up wiring board. Therefore, establishment of alignment technology becomes a problem in a case of to using an exposure device which exposes a pattern (an image) with light beam when manufacturing the build up wiring board.

On the other hand, by that an alignment mark is masked by a tape before plating and the tape is stripped (removed) after plating thereby the alignment mark can be visually identified in order to enable to identify the alignment mark, identification may be carried out by using the image-pickuping device mentioned above or the like. However, manufacturing processes cannot be automated by the method mentioned above, merit to introduce the device fades, and there is a problem that a manufacture cost has risen.

SUMMARY OF THE INVENTION

The present invention was developed in consideration of the above mentioned problems, and an object of the present invention is to provide an exposure device by which aligning of an exposure pattern is realized when manufacturing a build-up structure such as a build up wiring board or the like, and which can cope with automation of manufacturing process.

A first aspect of the present invention is an exposure device which exposes a photosensitive material with a light beam modulated in accordance with image information, the device comprising a reading section which reads a radioscopic image of a specific pattern provided on an inner layer of a laminated structure; and an aligning section which aligns an exposure position of the photosensitive material laminated on a surface of an outer layer of the laminated structure, on the basis of position information of the read radioscopic image of the specific pattern.

In a second aspect of the present invention is the image recording device according to the first aspect, the device further comprises a spatial modulating element which modulates the light beam, and a moving section which relatively moves the spatial modulating element and the laminated structure in a direction parallel to a surface, of the photosensitive material, to be exposed, wherein the aligning section includes the moving section.

In a third aspect of the present invention is the image recording device according to the first aspect, the device further comprises a spatial modulating element which modulates the light beam, and a control section which controls the spatial modulating element according to a control signal generated in accordance with the image information, wherein the aligning section includes the control section.

In each of a fourth, a fifth and sixth aspects of the present invention is the image recording device according to the first, the second and the third aspects, respectively, the reading section is an X-ray image-pickup section which picks up a radioscopic image using an X-ray irradiated on the laminated structure.

In each of a seventh, an eighth and a ninth aspects of the present invention is the image recording device according to the first, the second and the third aspects, respectively, the laminated structure is a build-up wiring board comprising a core substrate as the inner layer and at least one build-up layer as the outer layer.

In a tenth aspect of the present invention is the image recording device according to the first aspect, the device further comprises a spatial modulating element which modulates the light beam, a moving section which relatively moves the spatial modulating element and the laminated structure in a direction parallel to a surface, of the photosensitive material, to be exposed of the photosensitive material, and a control section which controls the spatial modulating element according to a control signal generated in accordance with the image information, wherein the aligning section includes the moving section and the control section.

In an eleventh aspect of the present invention is the image recording device according to the tenth aspect, the moving section aligns the exposure position of the photosensitive material in at least one direction selected from among a main scanning direction, a sub scanning direction and a rotation direction, and the control section aligns the exposure position of the photosensitive material in the remaining direction among the main scanning direction, the sub scanning direction and the rotation direction.

In a twelfth aspect of the present invention is the image recording device according to the eleventh aspect, the reading section is an invisible light image-pickup section which picks up a radioscopic image using an invisible light irradiated on the laminated structure.

In a thirteenth aspect of the present invention is the image recording device according to the twelfth aspect, the invisible light is radiation which can transmit through the laminated structure.

In the first aspect of the present invention, the reading section reads the radioscopic image of the specific pattern provided on the inner layer of the laminated structure. The aligning section carries out an exposure alignment of the photosensitive material laminated on the surface of the outer layer of the laminated structure on the basis of the position information of the read radioscopic image of the specific pattern. That is, a position (an image recorded position) at which the photosensitive material is exposed with the light beam modulated in accordance with the image information is aligned to a predetermined position which is determined by the specific pattern being as the reference. The radioscopic image of the specific pattern is obtained, for example, by irradiating a light of wavelength which transmits through the laminated structure and the specific pattern.

As the result, in the present invention, when manufacturing of the laminated structure such as the build-up wiring board or the like, the alignment of the exposure pattern, that is, the exposure-alignment of the circuit pattern formed on the surface of the build up layer (the outer layer) can be realized by the alignment mark (the specific pattern) provided on the core substrate (the inner layer) being as reference. Further, it can be carried out to correspond to the automization of the manufacture process.

In the second aspect of the present invention, the alignment is carried out such that the spatial modulating element which modulates the light beam and the laminated structure are relatively moved by the moving section in the direction so as to be parallel to the surface to be exposed of the photosensitive material. The direction so as to be parallel to the surface to be exposed of the photosensitive material is a direction, for example, a main scanning direction of the light beam (a X direction), a sub scanning direction of the light beam (a Y direction), a rotation direction to which this X-Y coordinate system is rotated, and the like. Namely, the direction parallel to the surface to be exposed of the photosensitive material is one of the directions mentioned above, or combination of a plurality of directions mentioned above. The alignment of the exposure position can be easily realized due to that the an mechanically structured moving section is used as the aligning section mentioned above.

In the third aspect of the present invention, the control section controls the spatial modulating element to change modulating timing or the like of the light beam on the basis of the control signal generated in accordance with the image information. As the result, exposure alignment is carried out. Even if the aligning section is structured by the electrical control section which changes the modulating timing or the like of the light beam, the exposure pattern alignment can be carried out. Further, the device structure can be more simple compared to a case in which the an mechanically structured moving section is used as the aligning section.

In the fourth aspect of the present invention, the X-ray is irradiated on the laminated structure, and the X-ray image-pickup section picks up the radioscopic image (the X-ray transmitted through the laminated structure). As the result, the radioscopic image of the specific pattern can be image-picked surely. Further, the above mentioned reading section can be realized by a practical structure which is taken the image-pickuping accuracy, the cost and the like into consideration.

BRIEF DESCRIPTION OF THE DRAWINGS

FIG. 1 is a perspective view illustrating an appearance of an exposure device related to an embodiment of the present invention.

FIG. 2 is a perspective view illustrating a scanner of the exposure device related to the embodiment of the present invention.

FIG. 5A is a cross sectional view illustrating a structure of the exposure head shown in FIG. 4 along an optical axis in a sub scanning direction.

FIG. 5B is a side view of FIG. 5A.

FIG. 8A is a plane view illustrating scanning locus of exposure beams in a case in which the DMD is not arranged in an inclined manner.

FIG. 8B is a plane view illustrating scanning locus of exposure beams in a case in which the DMD is arranged in an inclined manner.

FIG. 9A is a perspective view illustrating a structure of a fiber array light source.

FIG. 9B is a partial enlarged view of FIG. 9A.

FIG. 9C is a plane view illustrating an arrangement of emission points at a laser emitting section.

FIG. 9D is a plane view illustrating another example of an arrangement of the emission points at the laser emitting section.

FIG. 15 is a schematic block diagram of the exposure device related to the embodiment of the present invention.

FIG. 17A is a side view illustrating an exposure system of the present invention in a case in which the used region of the DMD is appropriate.

FIG. 17B is a cross sectional view of the FIG. 17A along the optical axis in the sub scanning direction.

DETAILED DESCRIPTION OF THE INVENTION

Figure 3A:
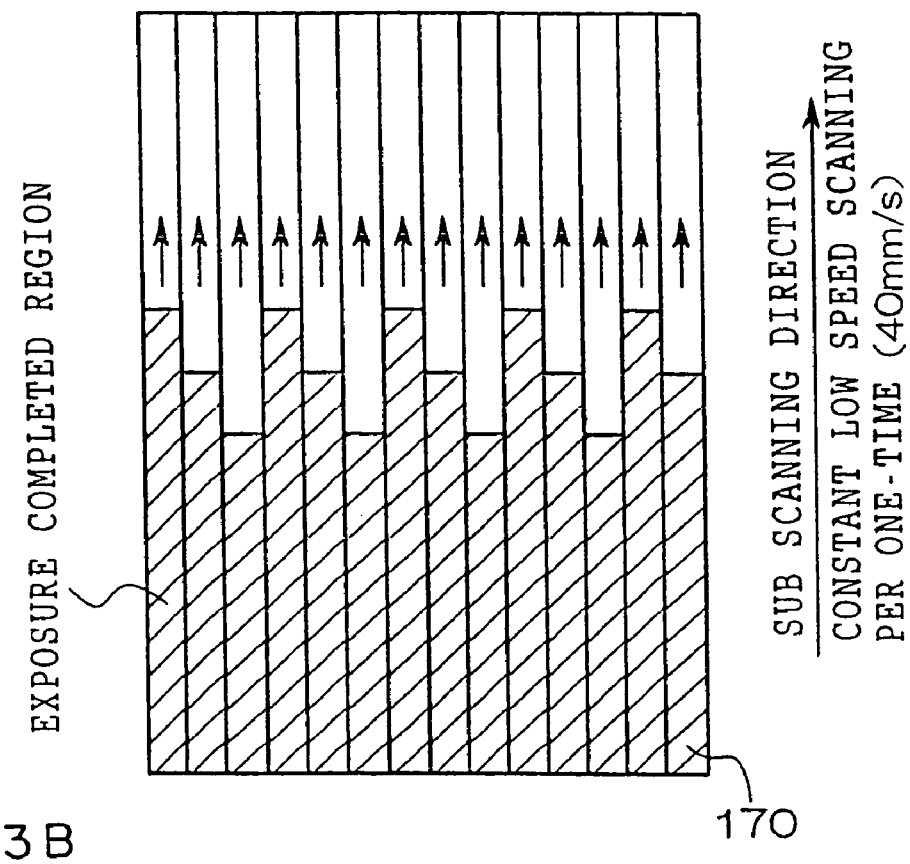
FIG. 3A is a plan view illustrating an exposed region formed on a photosensitive material.

Referring to drawings, an embodiment of the present invention will be described hereinafter in detail.

Structure of Exposure Device

An outside view of an exposure device relating to an embodiment of the present invention is illustrated in FIG. 1 and FIG. 15 is a block diagram illustrating a schematic structure of the device.

As shown in FIG. 1, an exposure device 100 is provided with a flat plate shaped stage 152. The stage 152 holds thereon a build up wiring board material (a build up wiring board 200) on which a photosensitive material 150 is coated such that the photosensitive material 150 is absorbed on a surface of the stage 152. A thick plate shaped setting stand 156 is supported by four leg portions 154. Two guides 158 are provided in an elongating manner along stage moving directions (a direction indicated by an arrow Y in FIG. 1) on a top surface of the setting stand 156. The stage 152 is arranged such that a longitudinal direction of the stage 152 corresponds to the stage moving direction. The stage 152 is supported on the guides 158 so as to be movable to-and-fro.

The stage 152 has a two-stages structure (a top stage and a bottom stage). That is, the stage 152 comprises a setting board 180 and a stage base 182. The build up wiring board 200 is set on the setting board 180. The stage base 182 supports the setting board 180 such that a center of the setting board 180 (a point of intersection of diagonals) is as a rotation center and the setting board 180 can be rotated (in a direction of arrow θ shown in FIG. 1) within a range of a predetermined angle. The setting board 180 is driven to rotate by means of a rotation driving device 184 provided between the setting board 180 and the stage base 182. The stage 152 is moved along the guides 158 due to that the stage base 182 is driven by a stage driving device 186. The rotation driving device 184 and the stage driving device 186 are connected to a driving device control section 188. The driving device control section 188 receives instruction from a controller 190 and outputs a control signal. The rotation driving device 184 and the stage driving device 186 are controlled on the basis of the control signal.

A gate 160 formed to have an U-shaped configuration is disposed at a central portion of the setting stand 156 such that the gate 160 crosses a moving pass of the stage 152. Two tip ends of the gate 160 are fixed to side surfaces of the setting stand 156, respectively. A scanner 162 is disposed at an one side with respect to the gate 160, and two X-ray CCD cameras 164 (164A and 164B) are disposed at the other side with respect to the gate 160, with a predetermined distance therebetween. The scanner 162 and X-ray CCD cameras 164 are attached on the gate 160 respectively such that the scanner 162 and X-ray CCD cameras 164 are positioned above the moving path of the stage 152 in a fixed manner. In addition, the scanner 162 is controlled by a scanner control section 192 connected to the controller 190.

Inside the setting stage 156, X-ray light sources 165A and 165B are provided. Each of the X-ray light sources 165A and 165B are positioned below the respective X-ray CCD cameras 164A and 164B, and face the respective X-ray light sources 165A and 165B. X-rays are irradiated upward from the respective X-ray light sources 165A and 165B, and are incident to the respective (namely, corresponding) X-ray CCD cameras 164A and 164B. Operations of these X-ray CCD cameras 164A and 164B and X-ray light sources 165A and 165B are controlled by means of controller 190. In addition, image data of pickuped images picked up by the X-ray CCD cameras 164A and 164B is sent to an image processing section 194, and a predetermined data processing is carried out. The processed data is input to the controller 190.

The scanner 162 is provided with a plurality of exposure heads 166 (for example, fourteen exposure heads 166) arranged in a substantially matrix manner of m rows and n columns (for example, three rows and five columns), as shown in FIG. 2. Note that FIG. 3B illustrates an arrangement of the exposing areas 168 by the exposure heads 166, however, the exposure heads 166 are illustrated in FIG. 3B in order to show a relationship between the exposure heads 166 and the exposing areas 168. In this example, four exposure heads 166 are disposed in a third row due to relationship with a width of the photosensitive material 150 (the build up wiring board 200). Hereinafter, an exposure head which is located in a position of m-th row and n-th column is represented as an exposure head $166_{mn}$.

An exposure area 168 by the exposure head 166 has a rectangular configuration whose short side is along a sub scanning direction. Therefore, with moving of the stage 152, exposed regions 170 having a band shape are formed on the photosensitive material 150 by the respective exposure heads 166. Hereinafter, an exposure area by the exposure head $166_{mn}$ located in the position of m-th row and n-th column is represented as an exposure area $168_{mn}$.

Figure 3B:
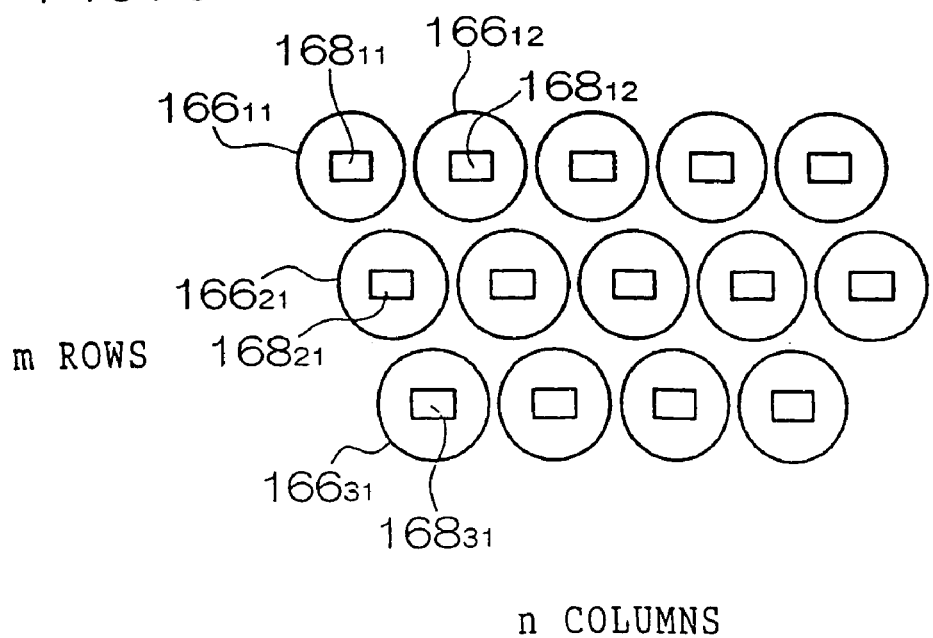
FIG. 3B illustrates an arrangement of exposing areas by each of exposure heads.

In addition, as shown in FIGS. 3A and 3B, the band shaped exposed regions 170 are arranged in a direction perpendicular to the sub scanning direction without a gap therebetween. This is archived due to the arrangement of the exposure heads 166. That is, in each row in which the exposure heads 166 are arranged in a line manner, the exposure heads 166 are arranged in the direction perpendicular to the sub scanning direction so as to have a predetermined interval therebetween (the predetermined interval is a length which is the natural number multiple of a long side of the exposure area 168, in the present embodiment, the predetermined interval has a length twice of the long side of the exposure area 168). Further, a position of the exposure head $166_{21}$ is shifted in the direction perpendicular to the sub scanning direction with respect to a position of the exposure head $166_{11}$, and a position of the exposure head $166_{31}$ is shifted in the direction perpendicular to the sub scanning direction with respect to the position of the exposure head $166_{21}$. Therefore, a portion between the exposure area $168_{11}$ and the exposure area $168_{12}$ in the first row, which portion cannot be exposed by the exposure head $166_{11}$ and the exposure head $166_{12}$, is exposed by the exposure head $166_{21}$ in the second row and the exposure head $166_{31}$ in the third row.

Figure 4:
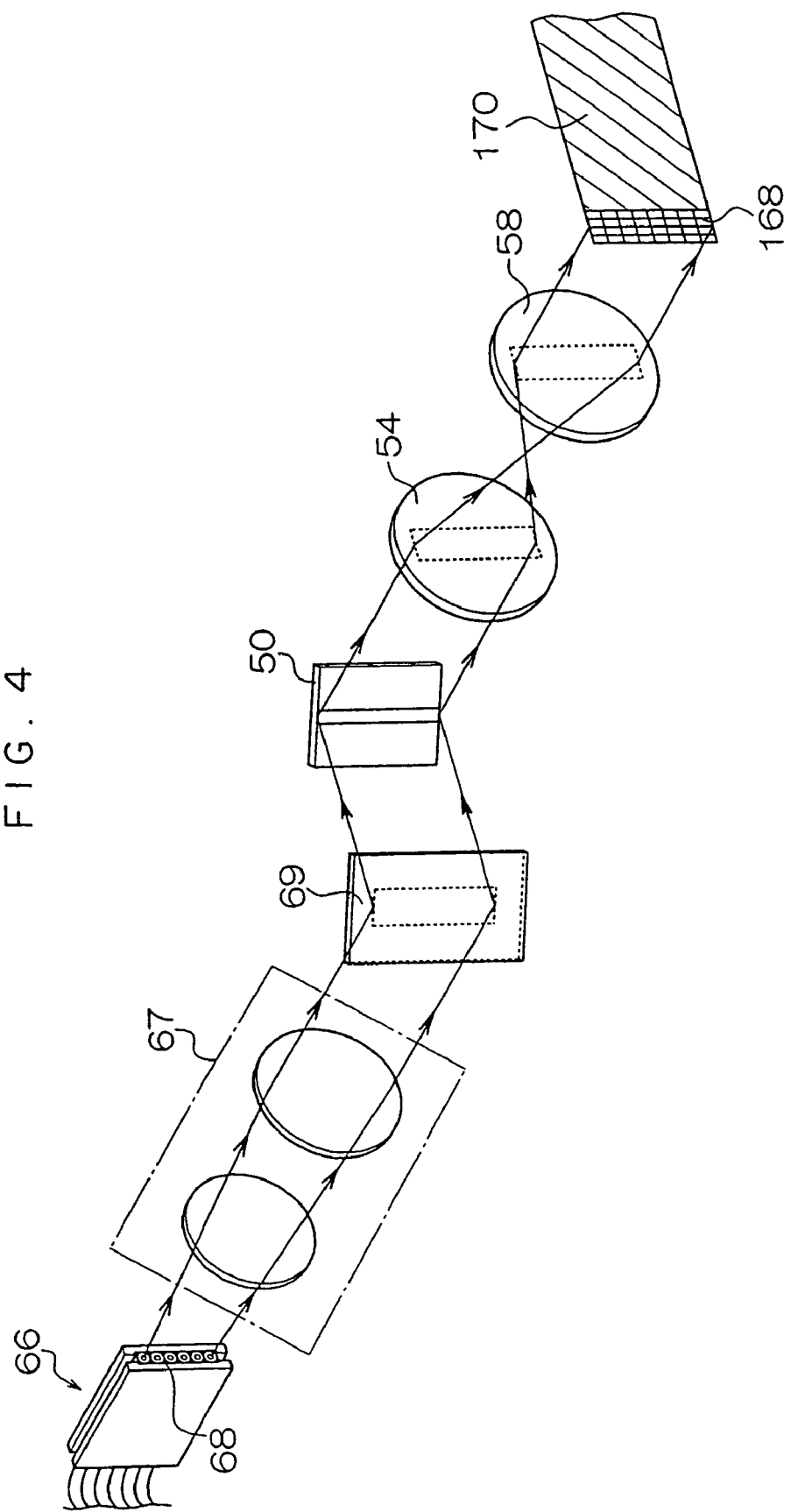
FIG. 4 is a perspective view illustrating schematic structure of the exposure head of the exposure device related to the embodiment of the present invention.

Each of the exposure heads $166_{11}$–$166_{mn}$ is provided with a digital micro-mirror device (DMD) 50 as shown in FIG. 4 and FIGS. 5A and 5B. The DMD 50 is as a spatial modulation element which modulates an incident light beam in accordance with image data every each pixel.

An image data processing section and a mirror driving control section are built in the scanner control section 192 which controls driving of the scanner 162. In the image data processing section, at every each exposure head 166, control signals for controlling driving each micro-mirror in a region to be controlled in the DMD 50 are generated on the basis of image data inputted from the controller 190. The region to be controlled is described later. In addition, in the mirror driving control section, on the basis of the control signals generated in the image data processing section, an angle of a reflection surface of each micro-mirror of the DMD 50 is controlled at every each exposure head 166. Control of the angle of the reflection surface of the DMD 50 is described later.

A fiber array light source 66, a lens system 67 and a mirror 69 are disposed in that order at a light incident side of the DMD 50. The fiber array light source 66 is provided with a laser emitting section at which emitting ends (emitting points) are arranged in a line manner in a direction corresponding to the long side of the exposure area 168. The lens system 67 compensates the laser light emitted from the fiber array light source 66 and condenses the laser light on the DMD 50. The laser beam transmitted the lens system 67 is reflected toward the DMD 50 on the mirror 69.

The lens system 67 comprises a pair of lenses 71, a pair of lenses 73 and a condensing lens 75. The combination lenses 71 collimate the laser beam emitted from the fiber array light source 66 such that the laser beam becomes parallel. The combination lenses 73 compensate the collimated laser beam such that a light amount distribution of the laser beam becomes uniform. The condensing lens 75 condenses the laser beam in which the light amount distribution is uniformed on the DMD 50. Further, the combination lenses 73 transmit a light so as to spread a flux of the light in the vicinity of an axis of the lenses in an arrangement direction of the laser beam emitting ends, and transmit a light so as to narrow the flux of the light at portions apart from the axis of the lenses in the arrangement direction of the laser beam emitting ends. Further, the combination lenses 73 transmit a light as it is in a direction orthogonal to the arrangement direction of the laser beam emitting ends. Therefore, the combination lenses 73 compensate the laser beam such that the light amount distribution of the laser beam becomes uniform.

In addition, in the light reflection side of the DMD 50, lens systems 54 and 58 are provided. The lens systems 54 and 58 focus (image-form) the light beam which has been reflected by the DMD 50 on a scan surface (a surface to be exposed) 56 of the photosensitive material 150. The lens systems 54 and 58 are disposed such that a relation of the DMD 50 and the surface to be exposed 56 is conjugate.

Figure 6:
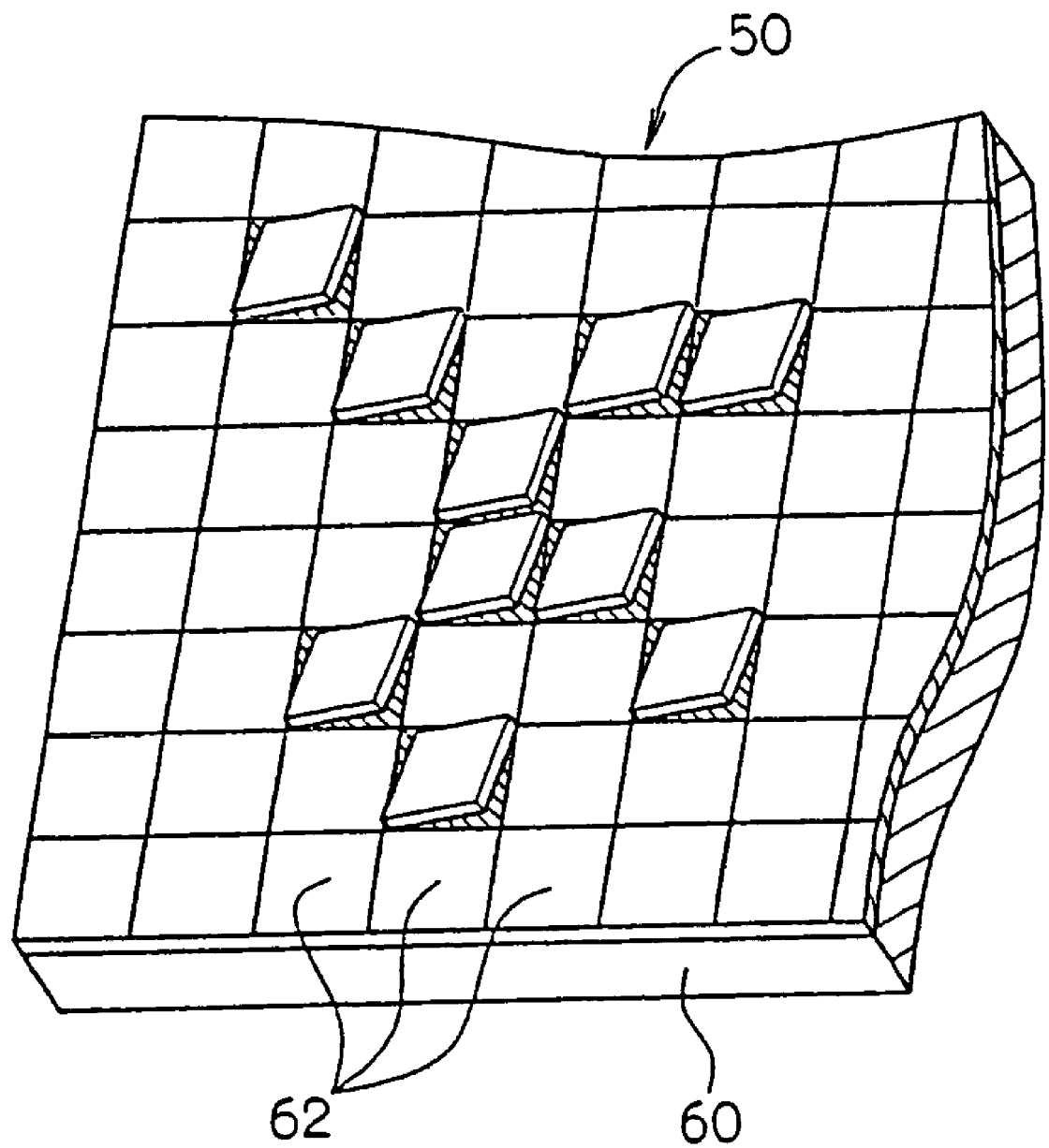
FIG. 6 is a partial enlarged view illustrating a structure of a digital micro-mirror device (DMD).

As shown in FIG. 6, on a SRAM cell (a memory cell) 60, a minute mirror (a micro mirror) 62 is arranged such that the minute mirror is supported by leg portions. That is, the DMD 50 is a mirror device in which a lot of (for example, 600×800) minute mirrors forming pixels are arranged in a grid manner. At an uppermost portion of each pixel, the micro mirror 62 supported by the leg portions is provided, and a material having high reflection factor such as aluminum or the like is vapour-deposited on a surface of the micro mirror 62. The reflection factor of the micro mirror 62 is equal to or more than 90%. In addition, directly below the micro mirror 62, via the leg portions including a hinge and a yoke, the SRAM cell 60 of a CMOS (a complementary metal oxide semiconductor) (a silicon gate) produced at a production line of normal semiconductor memory is disposed. Overall structured is in a monolithic manner (an integral type).

Figure 7A:
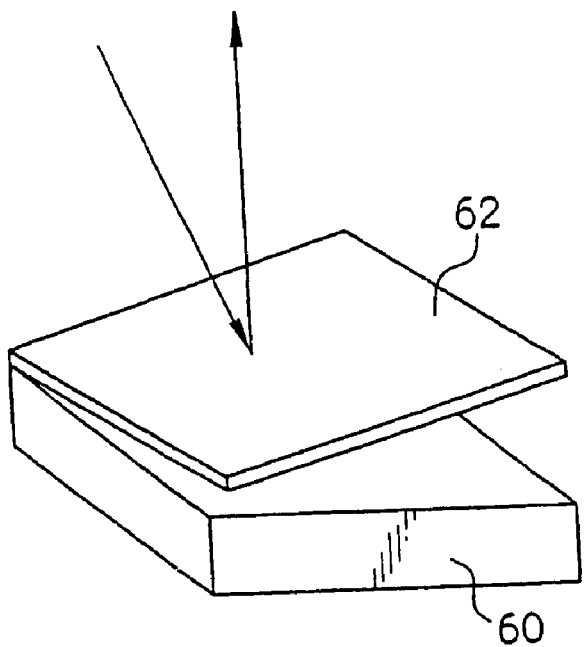
FIG. 7A is an explaining view for explaining an operation of the DMD.
Figure 7B:
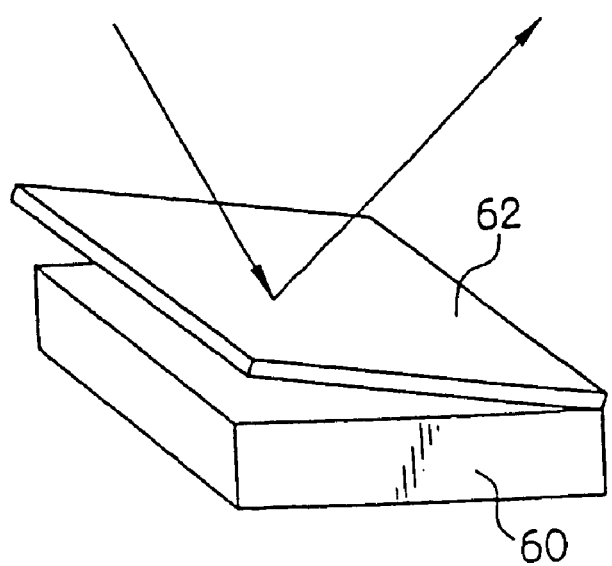
FIG. 7B is an explaining view for explaining an operation of the DMD.

The micro mirror 62 supported by the leg portions is inclined in a range of ±α degree (for example, ±10 degrees) with respect to a substrate on which the DMD 50 is provided (an inclination (a rotation) axis is a diagonal of the micro mirror) when digital signal is written in the SRAM cell 60 of the DMD 50. FIG. 7A shows a state in which the micro mirror 62 is inclined by +α degree, indicating that the micro mirror 62 is ON state. FIG. 7B shows a state in which the micro mirror 62 is inclined by −α degree, indicating that the micro mirror 62 is OFF state. Therefore, in accordance with an image signal, an inclination of the micro mirror 62 in each pixel of the DMD 50 is controlled, for example, as shown in FIG. 6. As the result, the light incident to the DMD 50 is each reflected by the micro mirror 62 in accordance with the inclination of the micro mirror 62 (to a direction in accordance with the inclination of the micro mirror 62).

In FIG. 6, an one part of the DMD 50 is magnified, and an example of a state in which the micro mirrors 62 are controlled such that the micro mirrors 62 are inclined by +α degree or −α degree is shown. On-off control of each micro mirror 62 is carried out by the scanner control section 192 in which an instruction from the controller 190 is received. In addition, to a direction to which the light beam is reflected by the micro mirror 62 which is OFF state, an optical absorption body (not shown in the drawings) is provided.

In addition, it is desirable that the DMD 50 is disposed such that a short side of the DMD 50 is slightly inclined with respect to the sub scanning direction by a predetermined angle θ (for example, 1°–5°). FIG. 8A shows a scanning locus of each reflection light image (exposure beam) 53 by each (corresponding) micro mirror in a case in which the DMD 50 is not inclined. FIG. 8B shows a scanning locus of each reflection light image (exposure beam) 53 by each (corresponding) micro mirror in a case in which the DMD 50 is inclined.

In the DMD 50, many sets (for example, 600 sets) of micro mirror columns are arranged in a short direction (a width direction) of the DMD 50. In each micro mirror column, a lot of (for example, 800) the micro mirrors are arranged in a longitudinal direction of the DMD 50. As shown in FIGS. 8A and 8B, a pitch P2 of the scanning locus (the scanning line) of the exposure beam 53 by each micro mirror (a distance between the adjacent scanning lines) in a case in which the DMD 50 is inclined is narrower than a pitch P1 of the scanning locus (the scanning line) in a case in which the DMD 50 is not inclined. That is, a resolution can be much improved in the case in which the DMD 50 is inclined. On the other hand, a scanning width W1 in the case in which the DMD 50 is not inclined is substantially the same as a scanning width W 2 in the case in which the DMD 50 is inclined, because an inclined angle of the DMD 50 is minute.

In addition, exposure is carried out by the different micro mirror lines on the same scanning line in a multiple manner (a multiplex exposure is carried out). As the result, due to the multiplex exposure, a slight small amount of an exposure position can be controlled, and high accuracy exposure can be realized. In addition, a splicing portion (a boundary) caused by the plural exposure heads arranged in a main scanning direction can be jointed without a step (in a uniform manner) by the slight small amount exposure position control.

If each micro mirror column is shifted in a direction orthogonal to the sub scanning direction by a predetermined distance with respect to the adjacent micro mirror column, that is, if the micro mirror columns are arranged in a zigzag manner, instead of making the DMD 50 slant, a similar effect can be obtained.

The fiber array light source 66 is provided with a plurality of laser modules 64 (for example, 6) as shown in FIG. 9A. An one end of multi-mode optical fiber 30 is coupled with each laser module 64. An optical fiber 31 is connected to another end of the multi-mode optical fiber 30. A core diameter of the multi-mode optical fiber 30 is as the same as that of the optical fiber 31, but a clad diameter of the optical fiber 31 is smaller than that of the multi-mode optical fiber 30. The laser emitting section 68 is formed such that emitting ends of the optical fibers 31 (emission points) are arranged in one line in the main scanning direction that is perpendicular to the sub scanning direction as shown in FIG. 9C. As shown in FIG. 9D, the emission points can be arranged in two lines in the main scanning direction.

End portions of the optical fibers 31 are put (sandwiched) between two support plates 65 whose surface are flat, and fixed as shown in FIG. 9B. In addition, a transparent protection board 63 such as a glass or the like is disposed at the light emitting side of the optical fibers 31 in order to protect end surfaces of the optical fibers 31. The protection board 63 may be disposed so as to closely contact the end surfaces of the optical fibers 31, or the end surfaces of the optical fibers 31 may be sealed in the protection board 63. The emitting end portions of the optical fibers 31 are easily deteriorated and dust is easily collected at the emitting end portions of the optical fibers 31 due to a light density being high. However, due to disposing the protection board 63, it can be prevented that dust adheres to the end surfaces of the optical fibers 31 and deterioration can be slowed.

In this example, in order to arrange the emitting end portions of the optical fibers 31, whose clad diameter is small, in one line without a gap therebetween as shown in FIG. 9C, the multi-mode optical fibers 30, whose clad diameter is large, are arranged in two lines manner (in the vicinity of the optical fibers 31) as shown in FIGS. 9A and 9B. That is, an optical fiber 31 is arranged between two optical fibers 31 in one line, but a multi-mode optical fiber 30 connected to the optical fiber 31 arranged between the two optical fibers 31 is disposed (piled) onto two multi-mode-optical fibers 30 which are respectively connected to the two optical fibers 31. Namely, the multi-mode optical fiber 30 connected to the optical fiber 31 arranged between the two optical fibers 31 and the two multi-mode optical fibers 30 respectively connected to the two optical fibers 31 are not arranged in one line.

Figure 10:
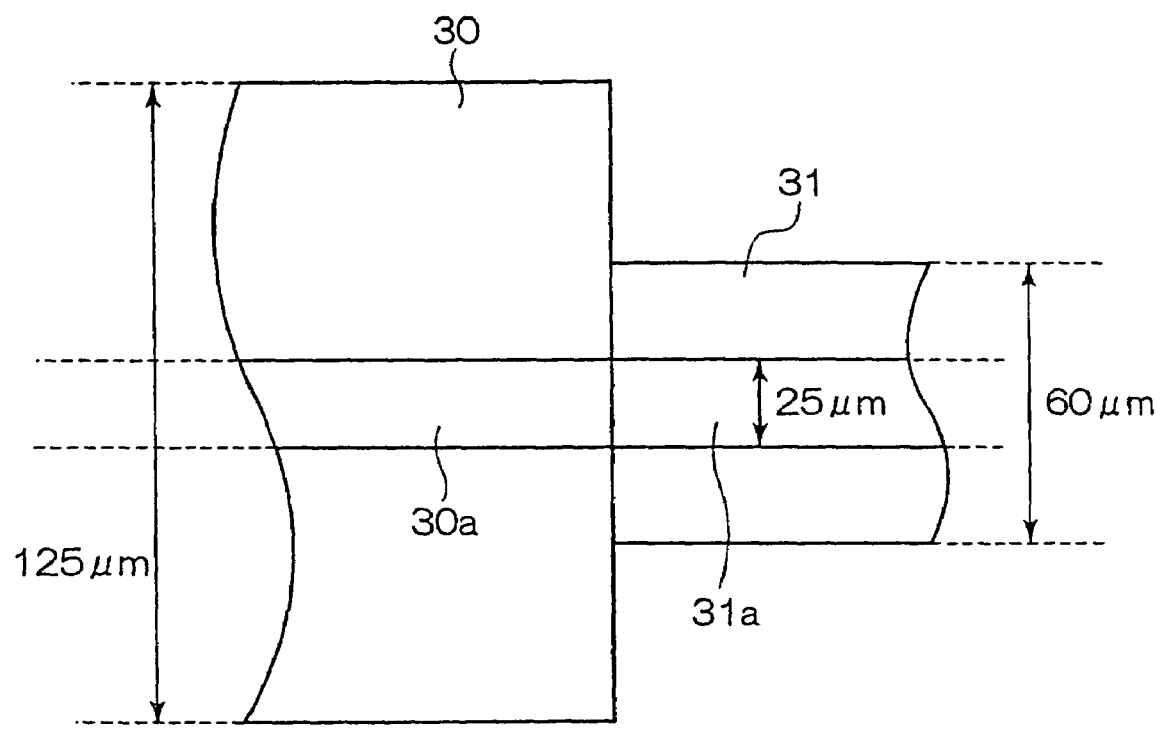
FIG. 10 illustrates a structure of a multi-mode optical fiber.

In the embodiment, for example, as shown in FIG. 10, the optical fiber 31, whose clad diameter is small and which has length of 1 cm–30 cm, is connected in a coaxial manner to a tip end at the laser light emitting side of the multi-mode optical fiber 30 whose clad diameter is large. An incident end surface of the optical fiber 31 is connected by fusion to the emitting end surface of the multi-mode optical fiber 30 such that a central axis of the optical fiber 31 coincides with that of the multi-mode optical fiber 30. As described above, a diameter of the core 31a of the optical fiber 31 is as the same as a diameter of the core 30a of the multi-mode optical fiber 30.

Further, a short length optical fiber may be connected to the emitting end of the multi-mode optical fiber 30 via a ferrule, an optical connector or the like. The short length optical fiber is formed such that an optical fiber whose length is short and a clad diameter is large is connected by fusion to an optical fiber whose clad diameter is small. Due to that the short length optical fiber is connected detachably to the multi-mode optical fiber 30 by using the connector or the like, in a case in which the optical fiber whose clad diameter is small is damaged, it is easy to replace this (damaged) tip portion. As the result, a cost required for maintenance the exposure head can be reduced. Hereinafter, there may be a case in which the optical fiber 31 is called as an emitting end (portion) of the multi-mode optical fiber 30.

As the multi-mode optical fiber 30 and the optical fiber 31, any one of a step index type optical fiber, a graded index type optical fiber and a complex type optical fiber can be used. For example, the step index type optical fiber made in Mitsubishi Cable Industries Co., Ltd. can be used. In this embodiment, the multi-mode optical fiber 30 and the optical fiber 31 are the step index-type optical fiber. In the multi-mode optical fiber 30, a clad diameter is 125 μm, a core diameter is 25 μm, NA is 0.2, a transmittance of an incident end surface coat is equal to or more than 99.5%. In the optical fiber 31, a clad diameter is 60 μm, a core diameter is 25 μm, NA is 0.2.

Figure 11:
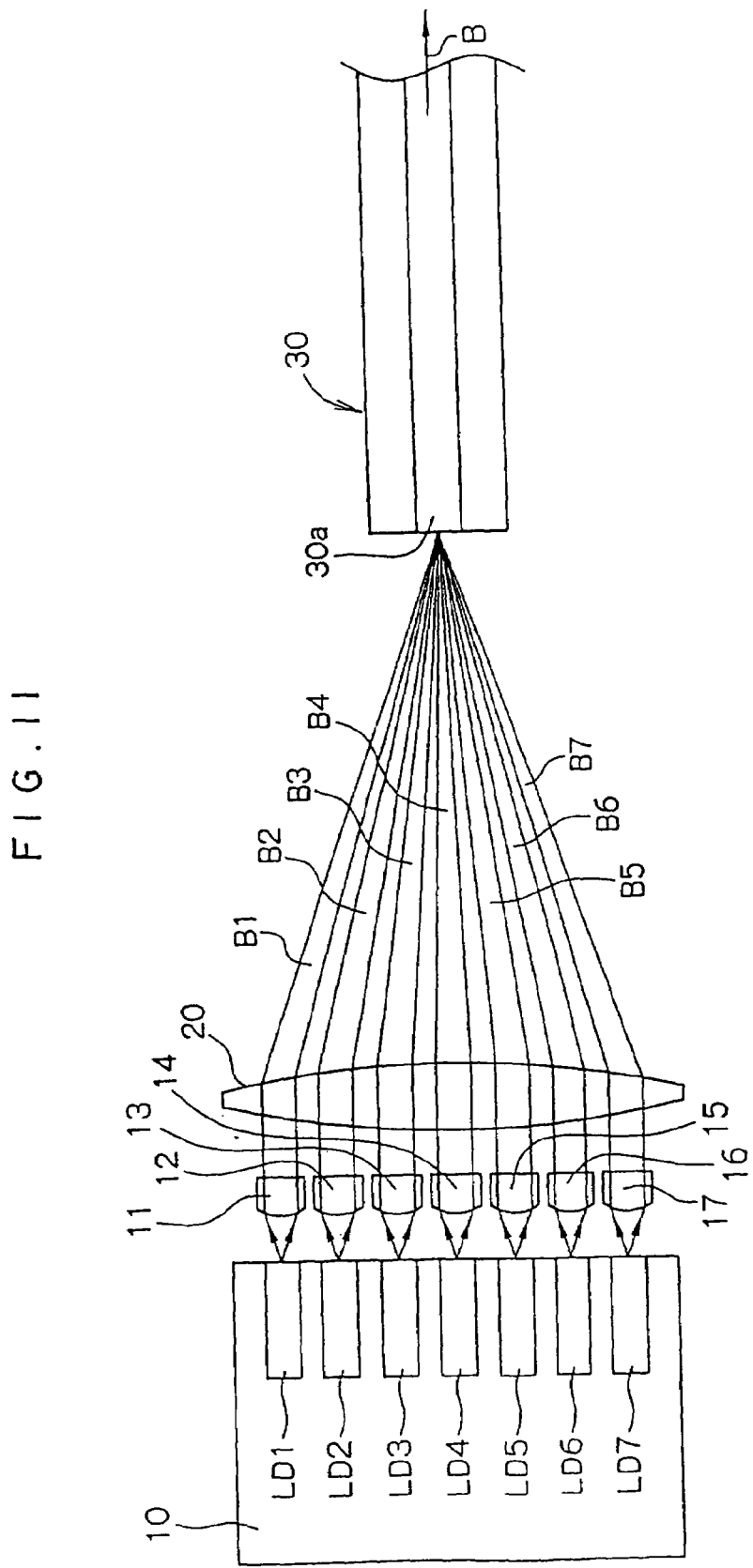
FIG. 11 is a plane view illustrating a structure of a composite-wave laser light source.

The laser module 64 is structured by a composite wave laser light source (a fiber light source) as shown in FIG. 11. The composite wave laser light source comprises a plurality of (for example, 7) UV (system) semiconductor lasers LD1, LD2, LD3, LD4, LD5, LD6 and LD7, collimator lenses 11, 12, 13, 14, 15, 16 and 17, a single condenser lens 20 and one multi-mode optical fiber 30. The UV semiconductor lasers are arranged and fixed on a heat block 10, and are a transversal multi-mode or a single mode having a chip configuration. The UV semiconductor lasers LD1–LD7 correspond to the collimator lenses 11–17, respectively. Oscillation wavelengths of the UV semiconductor lasers LD1–LD7 are the same, and maximum outputs of the UV semiconductor lasers LD1–LD7 are the same. In the embodiment, a number of the UV semiconductor lasers is seven, however, the present invention is not limited to the same.

Figure 12:
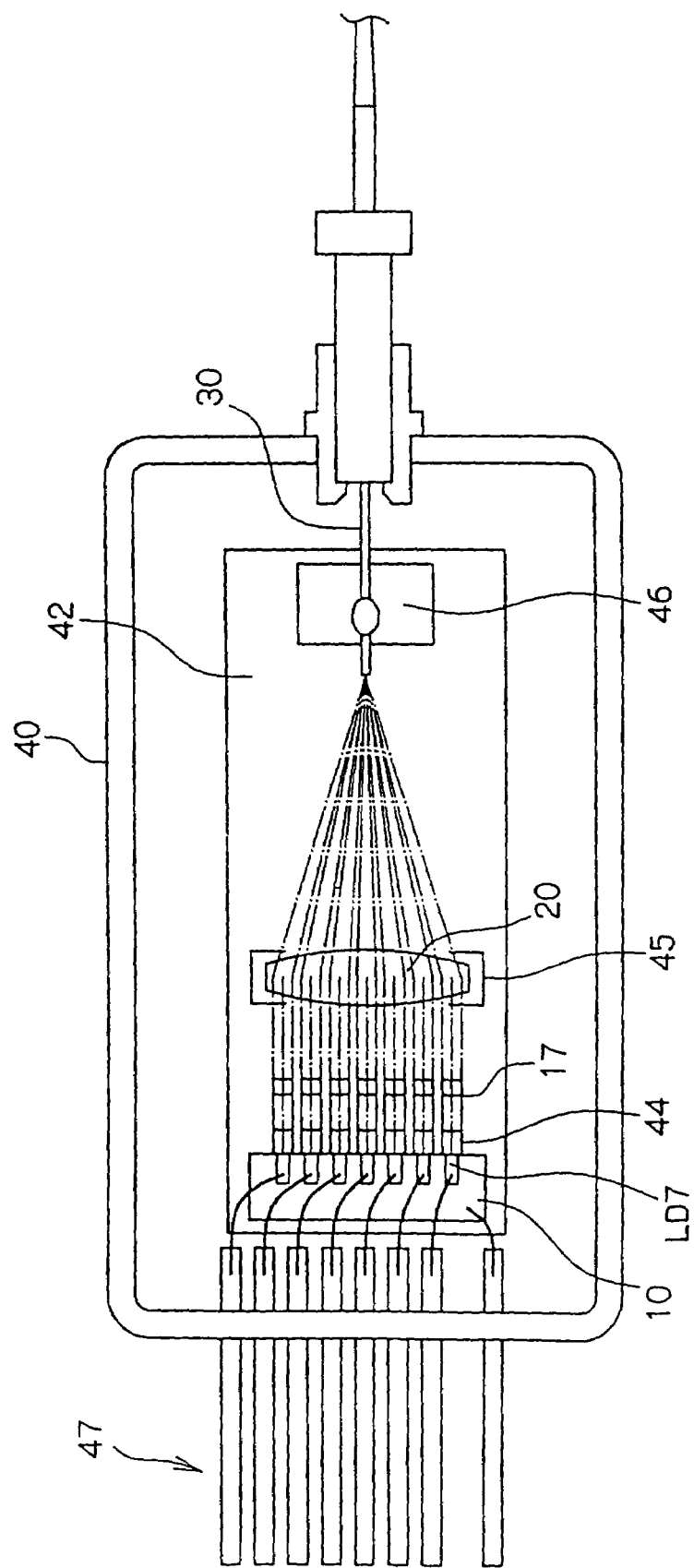
FIG. 12 is a plane view illustrating a structure of a laser module.
Figure 13:
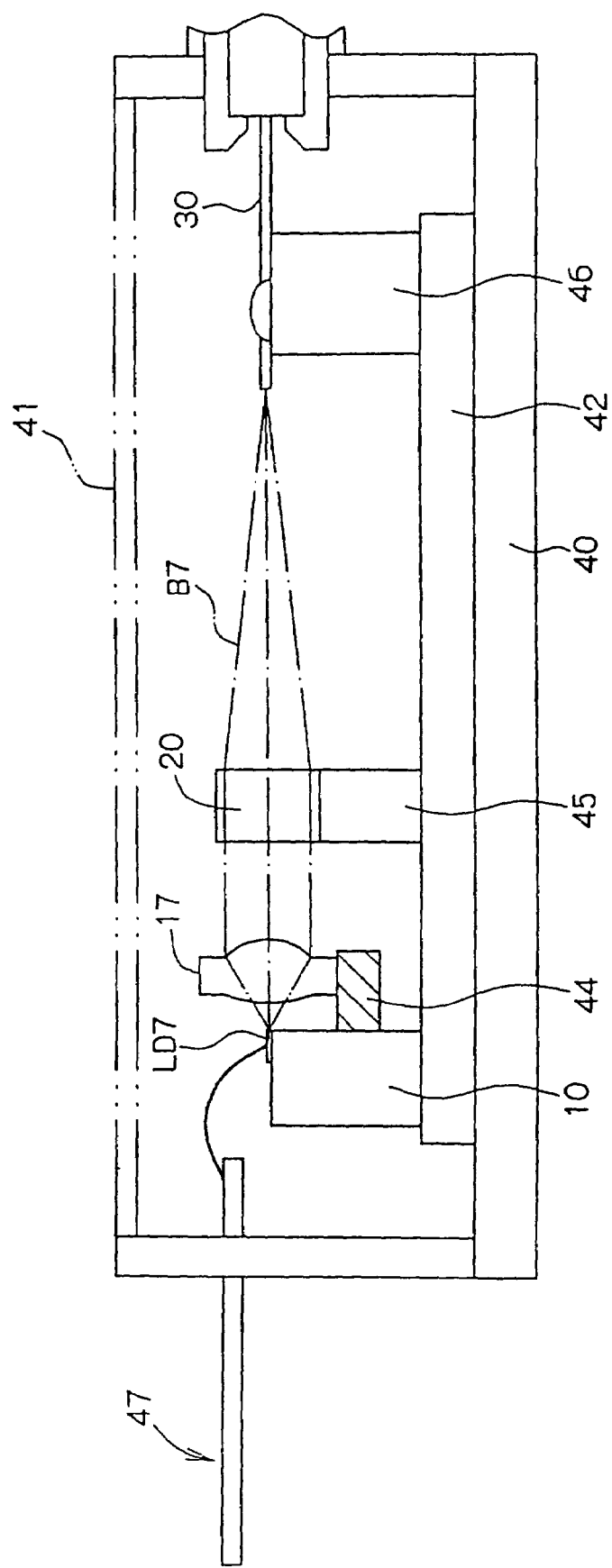
FIG. 13 is a side view illustrating a structure of the laser module shown in FIG. 12.

The composite wave laser light source described above is accommodated in a box shaped package 40 together with other optical elements as shown in FIG. 12 and FIG. 13. An upper side of the package 40 is open. The package 40 is provided with a package cover 41 for closing an opening of the package 40. Gas for sealing is filled into the package 40 in which the opening is closed by the package cover 41 after deairing process is carried out. As the result, the above mentioned composite wave laser light source is sealed gastightly within a closed space (a sealed space) formed by the package 40 and the package cover 41.

A base board 42 is fixed to a bottom of the package 40, the heat block 10, a condenser lens holder 45 which holds the condenser lens 20 and a fiber holder 46 which holds the incident end portion of the multi-mode optical fiber 30 are attached on a top surface of the base board 42. The emitting end portion of the multi-mode optical fiber 30 is drawn to an external of the package 40 from an opening formed on a wall surface of the package 40.

In addition, a collimator lens holder 44 is attached at a side surface of the heat block 10, and the collimator lenses 11–17 are held on the collimator lens holder 44. An opining is formed in a side wall surface of the package 40, and interconnections 47 which supply drive electric currents to the semiconductor lasers LD1–LD7 are drawn through this opening to an external of the package 40.

In order to prevent FIG. 13 from being complicated, a number is applied to only the UV semiconductor laser LD7 among the plurality of the UV semiconductor lasers, and a number is applied to only the collimator lens 17 among the plurality of collimator lenses.

Figure 14:
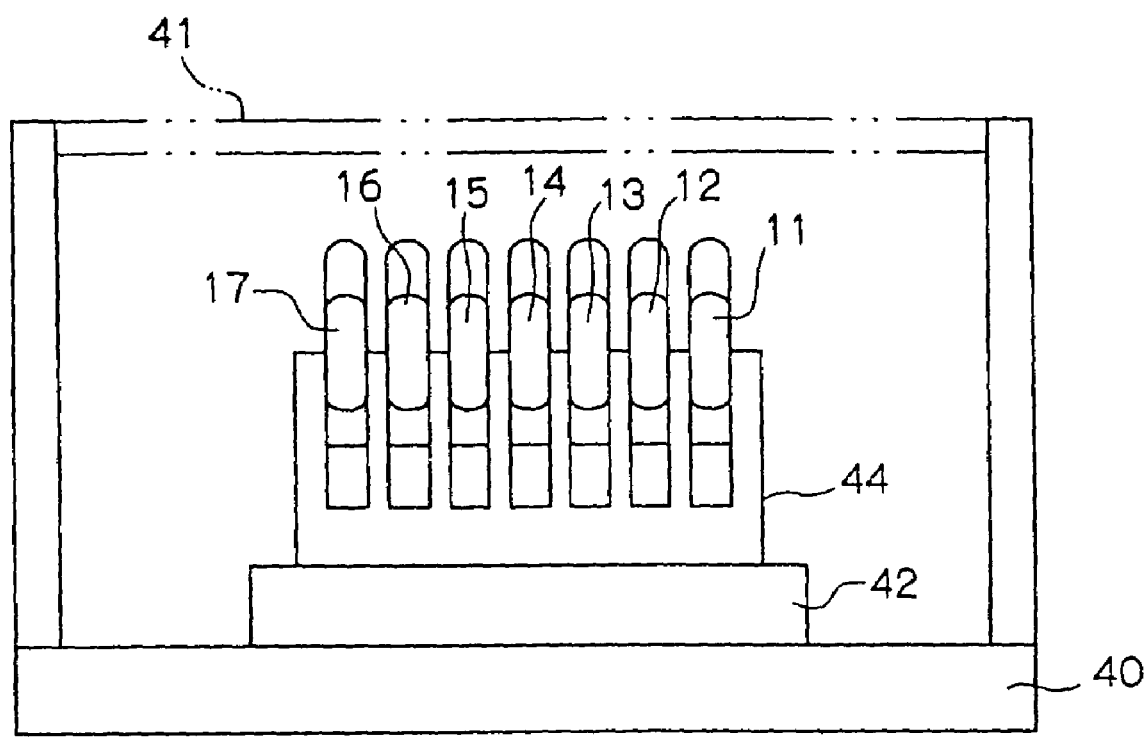
FIG. 14 is a partial side view illustrating a structure of the laser module shown in FIG. 12.

FIG. 14 shows a front configuration of a portion at which the above mentioned collimator lenses 11–17 are attached. Each of the collimator lenses 11–17 is formed in a configuration such like that a region including an optical axis of a circular lens provided with an aspheric surface is cut by planes which are parallel. Therefore, each has an elongated configuration. The collimator lens having elongated configuration can be formed, for example, by molding resin or optical glass. The collimator lenses 11–17 are nearly (closely) arranged in an arrangement direction of emission points of the UV semiconductor lasers LD1–LD7 (a right-left direction in FIG. 14) such that a longitudinal direction of the collimator lens is perpendicular to the arrangement direction of the emission points of the UV semiconductor lasers LD1–LD7.

On the other hand, as the UV semiconductor lasers LD1–LD7, lasers each of which is provided with an active layer whose emission width is 2 µm and which emit laser beams B1–B7, respectively, are used. The laser beams B1–B7 are emitted in a condition in which a spread angle in a direction parallel to the active layer is, for example, 10 degree, and a spread angle in a direction perpendicular to the active layer is, for example, 30 degree. The UV semiconductor lasers LD1–LD7 are arranged such that emission points are arranged in one line in the direction parallel to the active layer.

Therefore, the laser beams B1–B7 are incident to the respective collimator lenses 11–17 having elongated configuration mentioned above, in a state in which a direction in which the spread angle is large coincides with the longitudinal direction of the collimator lens and a direction in which the spread angle is small coincides with the width direction (a direction perpendicular to the longitudinal direction) of the collimator lens. That is, the width of each of the collimator lenses 11–17 is 1.1 mm, the length of that is 4.6 mm, diameters of the beams incident to the respective collimator lens 11–17 are 0.9 mm in the horizontal direction and 2.6 mm in the vertical direction. In addition, in each of the collimator lenses 11–17, a focus distance f1 is 3 mm, NA is 0.6, and a lens arrangement pitch is 1.25 mm.

The condenser lens 20 is formed in a configuration such like that a region including an optical axis of a circular lens provided with an aspheric surface is cut by planes which are parallel. Therefore, the condenser lens 20 has an elongated configuration in the horizontal direction, and has a short dimension in a direction perpendicular to the horizontal direction. For example, in the condenser lens 20, a focus distance f2 is 23 mm, NA is 0.2. This condenser lens 20 can be formed, for example, by molding resin or optical glass.

Operation of Exposure Device

Next, an operation of the exposure device mentioned above will be explained.

In each exposure head 166 of the scanner 162, the laser beams B1, B2, B3, B4, B5, B6 and B7 are emitted, in a state of divergent ray, from the respective UV semiconductor lasers LD1–LD 7 included in the composite wave laser light source of the fiber array light source 66. These laser beams B1, B2, B3, B4, B5, B6 and B7 are changed to parallel lights by means of the corresponding collimator lenses 11–17. The laser beams B1, B2, B3, B4, B5, B6 and B7 which are collimated are collected (condensed) by means of the condenser lens 20, and converges in the incident end surface of the core 30a of the multi-mode optical fiber 30.

In this embodiment, a collection optic system is constructed by the collimator lenses 11–17 and the condenser lens 20, and a composite-wave optic system is constructed by the collection optic system and the multi-mode optical fiber 30. That is, the laser beams B1–B7 condensed by the condenser lens 20 as mentioned above are incident into the core 30a of the multi-mode optical fiber 30, then transmits in the optical fiber. The laser beams are wave-compounded and the composite single laser beam B is emitted from the optical fiber 31 connected to the emitting end surface of the multi-mode optical fiber 30.

In a case in which a combination (bonding) efficiency of the laser beams B1–B7 to the multi-mode optical fiber 30 is 0.85 and each output of the UV semiconductor lasers LD1–LD7 is 30 mW in each laser module, the composite laser beam B of an output 180 mW (=30 mW×0.85×7) is obtained in each of the optical fibers 31 that are arranged in array manner. Therefore, an output at the laser outputting portion 68 in which six optical fibers 31 are arranged in array manner is about 1 W (=180 mW×6).

In the laser emitting portion 68 of the fiber array light source 66, high brightness emission points are arranged in the main scanning direction in one line. In a conventional fiber light source in which a laser light from a single semiconductor laser is connected (incident) to a single optical fiber, an output is low. Accordingly, a desired output cannot be obtained in a case in which optical fibers are not arranged in many lines (columns) in the conventional fiber light source. However, in the composite laser light source used in the present embodiment, an output is high, therefore, a desired output can be obtained even though a few lines arrangement, for example, an one line arrangement.

When image data in accordance with an exposure pattern is inputted into the controller 190, the image data is stored once in a frame memory in the controller 190. This image data is data in which a density of each pixel which forms an image is represented with binary (presence of a record of a dot or not).

The stage 152 on which the build up wiring board 200 is set is moved from an up stream side to a down stream side of the gate 160 at a constant speed along the guides 158 by the stage driving device 186. When the stage 152 passes under the gate 160 and the photosensitive material 150 (the build up wiring board 200) reaches a predetermined position, the image data stored in the frame memory is read such that each data corresponding to a plurality of lines of the image is sequential read. On the basis of the image data read, at the data processing section, a control signal is generated every each exposure head 166. Then, on the basis of the generated control signal, each of micro mirrors of the DMD 50 is on-off controlled every each exposure head 166 by the mirror driving control section.

When the laser light is irradiated from the fiber array light source 66 to the DMD 50, the laser beam reflected at the time of ON state of the micro mirror of the DMD 50 is imaged (image-formed) on a surface to be exposed 56 of the photosensitive material 150 by the lens systems 54 and 58. In this way, the laser light emitted from the fiber array light source 66 is on or off controlled every pixel, and the photosensitive material 150 (the exposure area 168) is exposed with a pixel unit which has a substantially the same number of the pixels used in the DMD 50. In addition, the photosensitive material 150 is sub scanned by the scanner 162 in a direction opposite to the stage moving direction due to that the photosensitive material 150 (the build up wiring board 200) is moved at the constant speed together with the stage 152, and an exposed region 170 of a belt shape is formed every each exposure head 166.

Figure 16A:
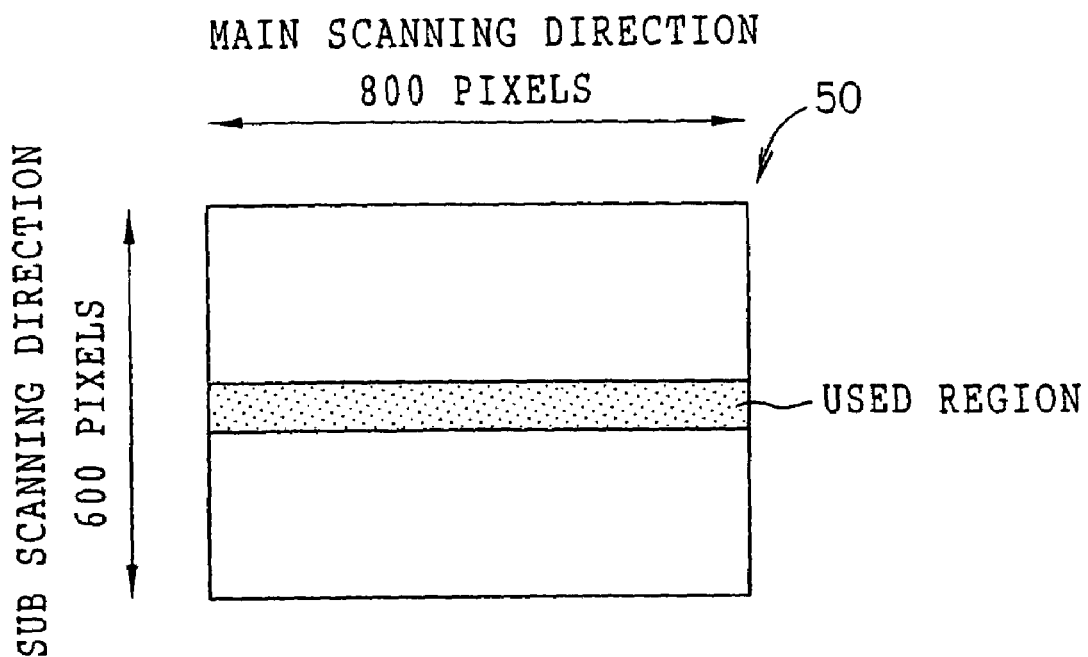
FIG. 16A illustrates an example of a used region of the DMD.
Figure 16B:
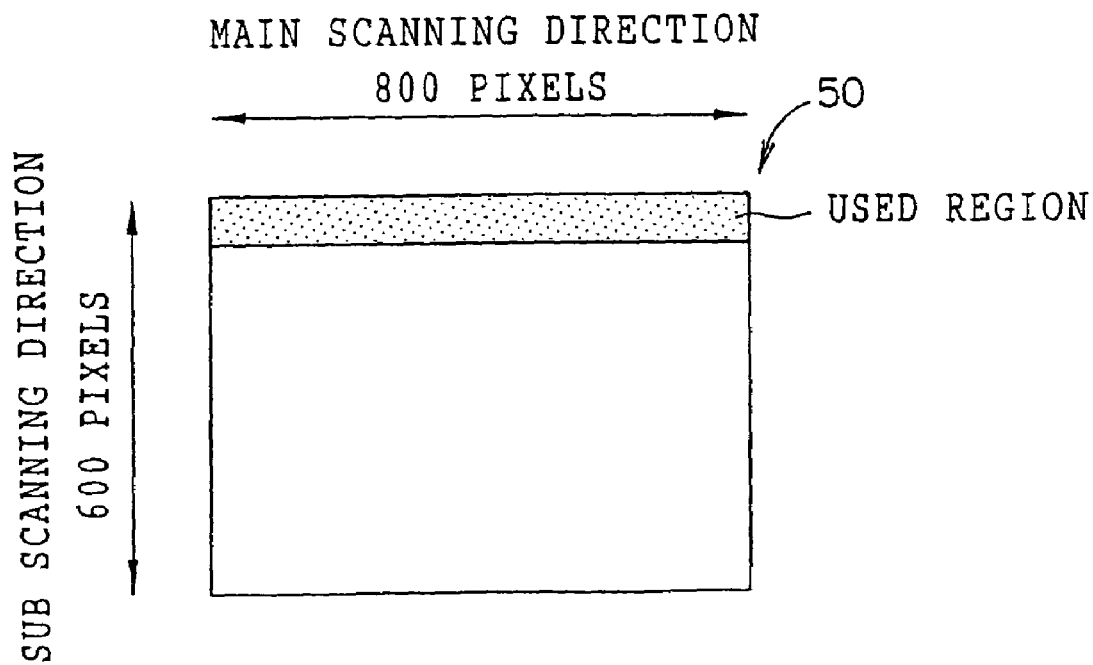
FIG. 16B illustrates another example of a used region of the DMD.

As shown in FIGS. 16A and 16B, in the present embodiment, in the DMD 50, the micro mirror columns of 600 sets, each of which 800 micro mirrors are arranged in the main scanning direction, are arranged in the sub scanning direction. However, in the present embodiment, the controller controls the DMD 50 such that only a portion of the micro mirror columns (for example, 100 sets of the micro mirror columns, that is, 800×100 micro mirrors) are driven.

As shown in FIG. 16A, micro mirror columns located in a central portion of the DMD 50 may be used, or micro mirror columns located in an end portion of the DMD 50 may be used as shown in FIG. 16B. In addition, in a case in which one (or some) micro mirror is damaged (has a defect), micro mirror columns which do not include a defect micro mirror are used, that is, micro mirror columns which are used can be changed appropriately depending on the situation.

A speed of processing data of the DMD 50 has a limited maximum speed. A modulation rate (speed) of an one line is determined in proportion to the number of pixels to be used. The modulation rate of the one line becomes faster by using only a part of the micro mirror columns compared with a case in which all micro mirror columns are used. Note that it is not necessary that all micro mirror columns in the sub scanning direction are used in a case of an exposure system in which the exposure head is relatively moved continuously with respect a surface to be exposed.

For example, in a case in which only 300 sets of the micro mirror columns among 600 sets of the micro mirror columns are used, the modulation rate per one line is two times as fast as that in a case in which all 600 sets of the micro mirror columns are used. Further, in a case in which only 200 sets of the micro mirror columns among 600 sets of the micro mirror columns are used, the modulation rate per one line is three times as fast as that in the case in which all 600 sets of the micro mirror columns are used. That is, in this case, a region having a length of 500 mm in the sub canning direction can be exposed in 17 seconds. Moreover, in a case in which only 100 sets of the micro mirror columns among 600 sets of the micro mirror columns are used, the modulation rate per one line is six times as fast as that in the case in which all 600 sets of the micro mirror columns are used. That is, in this case, the region having the length of 500 mm in the sub scanning direction can be exposed in 9 seconds.

More than or equal to 10 and less than or equal to 200 are desirable for the number of micro mirror columns to be used, that is, the number of micro mirrors arranged in the sub scanning direction. More than or equal to 10 and less than or equal to 100 are more desirable. An area of one micro mirror, corresponding to one pixel, is 15 μm×15 μm. Therefore, when converting the above into a micro mirror used region of the DMD 50, a region of more than or equal to 12 mm×15 μm and less than or equal to 12 mm×3 mm are preferable, and a region of more than or equal to 12 mm×150 μm and less than or equal to 12 mm×1.5 mm are more preferable.

If the numbers of micro mirror columns to be employed are within the above mentioned range, the laser beam emitted from the fiber array light source 66 is made substantially parallel by the lens system 67, and can be irradiated onto the DMD 50, as shown in FIGS. 17A and 17B. It is preferable that an irradiation region to which the laser light is irradiated by the DMD 50 agrees with the used region in the DMD 50. Because if the irradiation region is larger than the used region, usage-efficiency of the laser light falls.

On the other hand, it is necessary that a diameter in the sub scanning direction of the light beam condensed on the DMD 50 is made small by the lens system 67 depending on the numbers of micro mirrors arranged in the sub scanning direction. In a case in which the number of micro mirror columns to be used are less than ten, an angle of luminous flux incident to the DMD 50 becomes large, as the result, the depth of focus of the light beam on the scanned surface 56 becomes shallow (small). Therefore, it is not preferable that the number of micro mirror columns to be used are less than ten. In addition, it is preferable, in a point of view of modulation rate (speed), that the number of micro mirror columns to be used are less than or equal to 200. In addition, the DMD is a spatial modulation element of a reflection type, however, FIGS. 17A and 17B are development figures for explaining optical relation.

When the sub scanning of the photosensitive material 150 by the scanner 162 is finished, the stage 152 returns in its original position located in the most upstream side with respect to the gate 160 along the guides 158 by the stage driving device 186. Then, the stage 152 is moved from the up stream side to the down stream side with respect to the gate 160 in the constant speed along the guides 158 again.

Manufacture of a Build Up Wiring Board

Next, a manufacturing method of the build up wiring board by using the exposure device mentioned above will be explained.

Figure 18A:
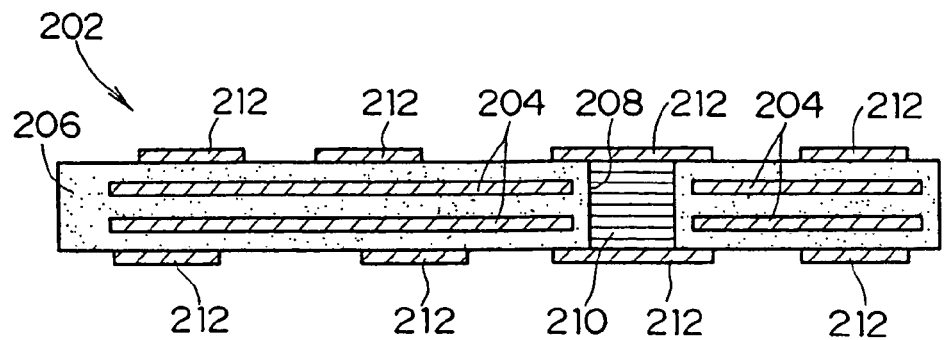
FIG. 18A is a cross sectional view for explaining a manufacture method of a build up wiring board and illustrating a core substrate.

As shown in FIGS. 18A–18I, manufacturing processes of the build up wiring board are shown. A core substrate 202 is shown in FIG. 18A. The core substrate 202 is manufactured by using method for manufacturing a normal multi-layer printed wiring board. In a substrate base 206, within which wiring patterns (electric circuits) 204 are formed, such as FR-4 or the like, a blind via hole 208 is embedded with a resin 210 at a stage in which internal layer patterns are connected electrically by through hole copper plating, and wiring patterns 212 on a surface are formed by etching (subtractive etching).

In the build up wiring board 200 of the present embodiment shown in FIG. 1, the blind via holes 208 (hereinafter, referred as BVH 208) shown in FIG. 18A and the like are formed in the vicinity of four corners of the rectangular shaped substrate, respectively. Each of the BVHs 208 serves an alignment mark when manufacturing the substrate.

Figure 18B:
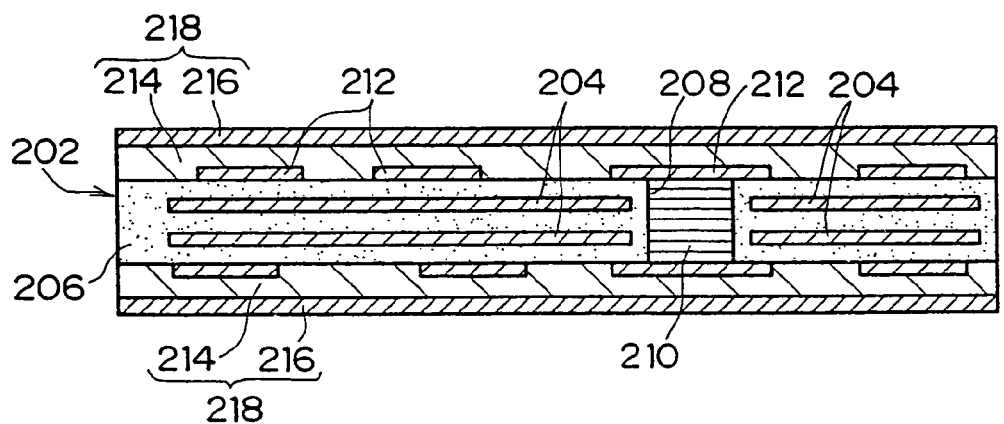
FIG. 18B is a cross sectional view for explaining a manufacture method of the build up wiring board and illustrating a state in which a build up layer is laminated on the core substrate.
Figure 18C:
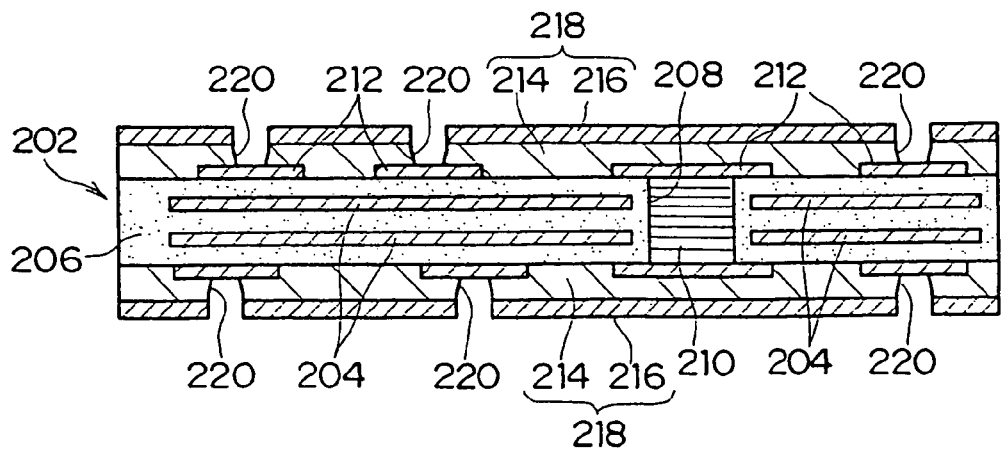
FIG. 18C is a cross sectional view for explaining the manufacture method of the build up wiring board and illustrating a state in which a prepared hole of a via hole is formed.

Next, as shown in FIG. 18B, build up layers 218 are laminated on surfaces of the core substrate 202. The build up layer 218 includes an insulation resin 214 and a copper foil 216. As shown in FIG. 18C, drilling processing (hole formation processing) for forming a micro (minute) hole by using a laser or the like is carried out at predetermined positions (corresponding to the wiring pattern 212) of the core substrate 202. Mortar-shaped hole portions 220 formed in the build up layer 218 by this laser processing are base holes of via holes for connecting different layers electrically.

Figure 18D:
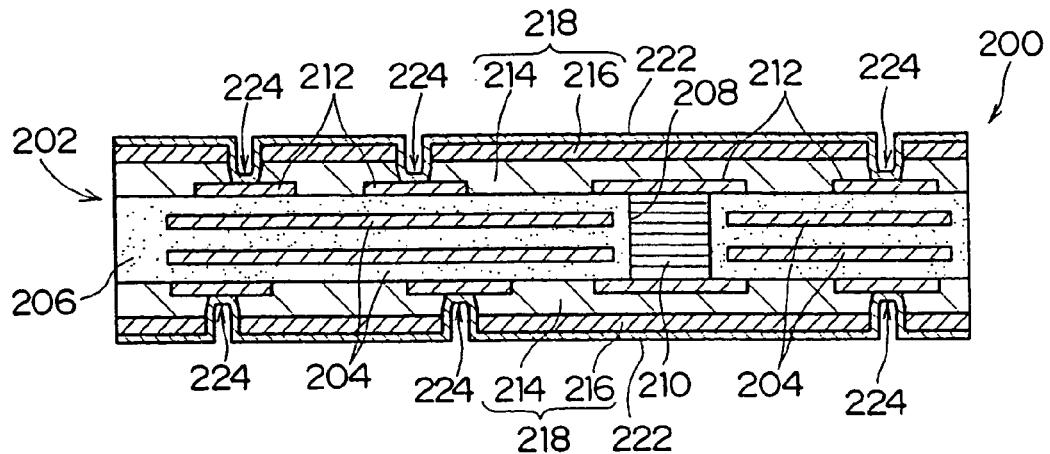
FIG. 18D is a cross sectional view for explaining the manufacture method of the build up wiring board and illustrating a state in which a conductive layer is plated on the build up layer.

As shown in FIG. 18D, copper plating is carried out to form conductor layers 222 on the surfaces of the build up layers 218. The conductor layer 222 is thin layer by plating, that is, the conductor layer 222 is a minute circuit pattern. The copper foil 216 of the build up layer 218 and the wiring pattern 212 on the surface of the core substrate 202 are connected electrically by the via hole 224 on which the conductor layer 222 is formed.

Figure 18E:
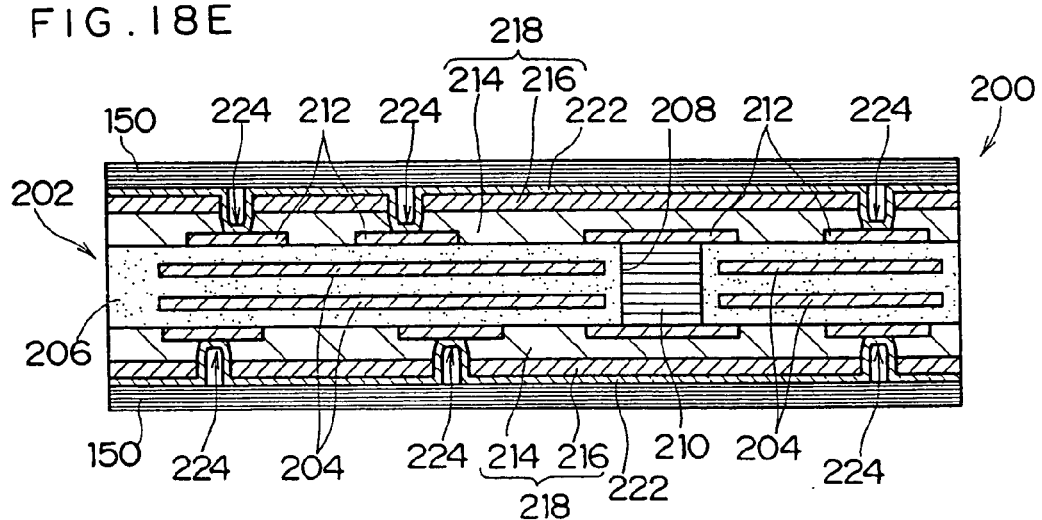
FIG. 18E is a cross sectional view for explaining the manufacture method of the build up wiring board and illustrating a state in which a photo resist is coated.

As shown in FIG. 18E, after coating (laminating in a case of a dry film) the photosensitive material (a photoresist) 150 such as a photosensitive epoxy resin or the like onto the surface of the substrate, the build up wiring board 200 is set on the stage 152 of the exposure device 100 of the present embodiment.

As shown in FIG. 19E, when the device is operated to start exposure operation, X-ray CCD cameras 164A and 164B and X-ray light sources 165A and 165B are operated at the same time of starting of movement of the stage 152. X-rays are irradiated from the X-ray light sources 165A and 165B, and transmit through the build up wiring board 200. As the result, radioscopic images due to the X-rays are pickuped by means of the X-ray CCD cameras 164A and 164B.

The build up wiring board 200 is conveyed accompanying with the movement of the stage 152. When the two BVHs 208 formed in the vicinity of a leading edge portion side in the moving direction approach below the X-ray CCD cameras 164A and 164B, radioscopic images of the respective BVH 208s are picked up by means of the respective X-ray CCD cameras 164A and 164B. When the BVH 208 is located within a predetermined range of an image angle of the X-ray CCD camera (for example, a central portion of the image angle), moving of the stage 152 stops temporarily, a radioscopic image of the BVH 208 is picked up in a stationary state. As the result, an outline of the BVH 208 is image-picked up clearly, the BVH 208 provided at the core substrate 202 as the alignment mark is identified.

After image-pickuping the BVH, the image data of the BVH is processed at the image processing section 194 such that a density of each of pixels forming image is binarized, and the data is inputted into the controller 190. The controller 190 calculates the data to obtain positional relation of the two BVHs 208. As the result, position data of the build up wiring board 200 is obtained. This position data includes a shift amount in a X direction (in the main scanning direction) and a shift amount in a rotation direction of the build up wiring board 200, and a position data in a Y direction (in the sub scanning direction). Then, the controller 190 outputs control signal for alignment to the scanner control section 192 and the drive device control section 188 such that an exposure position of the photosensitive material 150 exposed with the light beam becomes appropriate on the basis of the obtained position data.

In the present embodiment, aligning in the rotating direction is carried out first. When the control signal mentioned above is inputted into the drive device control section 188, the rotation driving device 184 is controlled to be driven, and the setting board 180 is rotated in a predetermined direction such that positions of the two BVHs 208 in the Y direction coincide each other, that is, a relative inclination between an exposure pattern and the photosensitive material 150 is compensated. By aligning of this rotating direction, alignment in the rotating direction of the exposure pattern is carried out, and inclination of scanning line of the exposure beam is compensated.

Due to that the build up wiring board 200 is rotated, each position (a position in the X direction and in the Y direction) of the BVHs 208 is moved from the original position at which image-pickuping is carried out. Therefore, on the basis of positions (image data) of the BVHs 208 after the alignment in the rotating direction is carried out, the controller 190 obtains a shift amount in the X direction and position data in the Y direction of the build up wiring board 200, and carries out alignment in each direction.

Regarding the alignment in the X direction, the image data in accordance with the exposure pattern stored in the frame memory in the controller 190 mentioned above is shifted by the shift amount in the X direction (in scanning direction of the exposure beam), and each micro mirror of the DMD 50 is on-off controlled at every each exposure head 166 by the control signal generated on the basis of the shifted image data. As the result, a scanning position of the exposure beam is aligned, and the alignment in the X direction of the pattern for exposing photosensitive material 150 is carried out.

Regarding the alignment in the Y direction, it is possible to carry out in the similar way in the case of the alignment in the X direction. However, in the present embodiment, in order to reduce calculation mount of image data to improve processing speed, a feed amount of the stage 152 is controlled. The control method is as follow. On the basis of the position in the Y direction of the BVH image data which BVH images are picked up by the X-ray CCD cameras 164A and 164B, the controller 190 outputs control signal for stage movement corresponding to irradiation timing of the light beam to the drive device control section 188. On the basis of the control signal, the driving device 186 is control to be driven by the drive device control section 188. Thus, the alignment in the Y direction of the exposure position is carried out.

When calculation process for carrying out above mentioned alignments completes, the stage 152, that has been stopped in order to image-pickup the BVHs, starts to move. As mentioned above, the exposure pattern that alignment has been completed is exposed on the photosensitive material 150 with the laser light irradiated from the scanner 162 accompanying with the stage 152 moving.

Figure 18F:
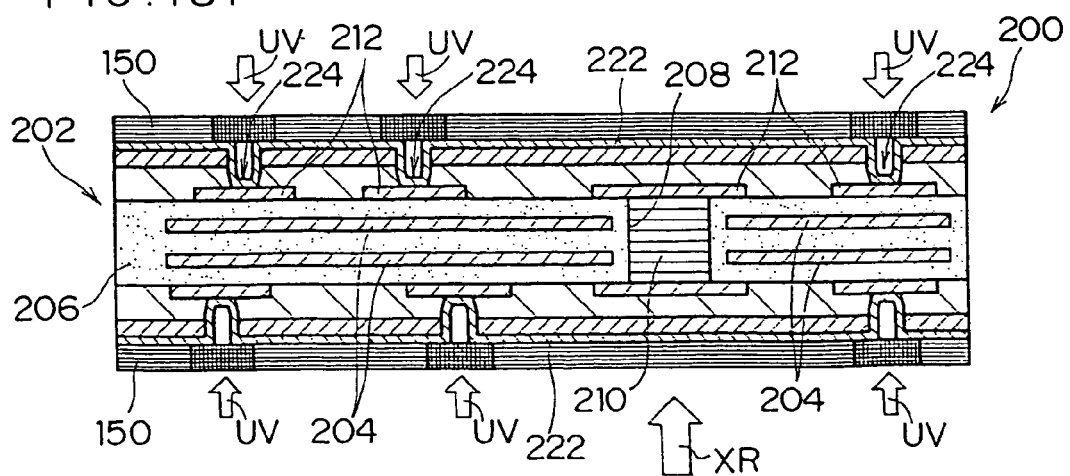
FIG. 18F is a cross sectional view for explaining the manufacture method of the build up wiring board and illustrating a state in which the photo resist is exposed.

For example, as shown in FIG. 18F, a predetermined region above the via hole 224, a circuit pattern formation part (not shown in the drawings) and the like are exposed with the laser light (arrows UV). In addition, arrows XR in the figure show X-rays irradiated onto the BVHs 208.

Figure 18G:
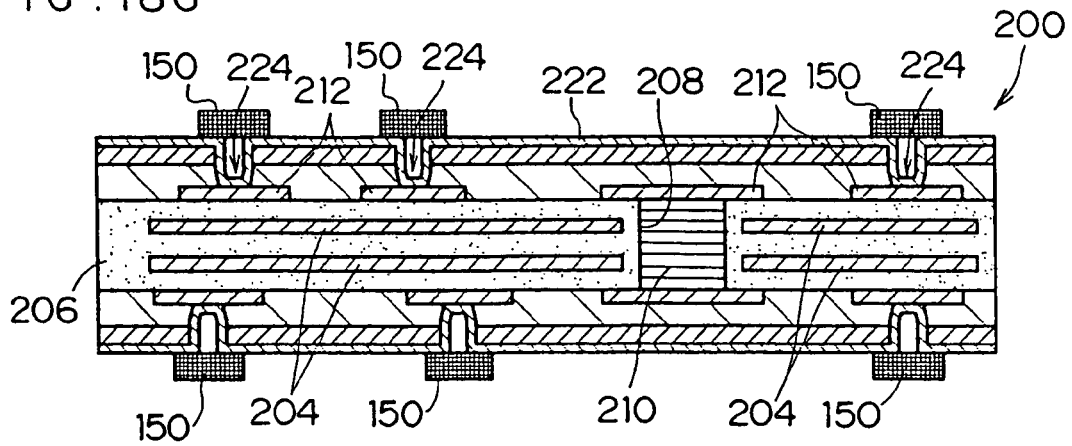
FIG. 18G is a cross sectional view for explaining the manufacture method of the build up wiring board and illustrating a state in which the photo resist is subject to developing process and an etching mask is formed.
Figure 18H:
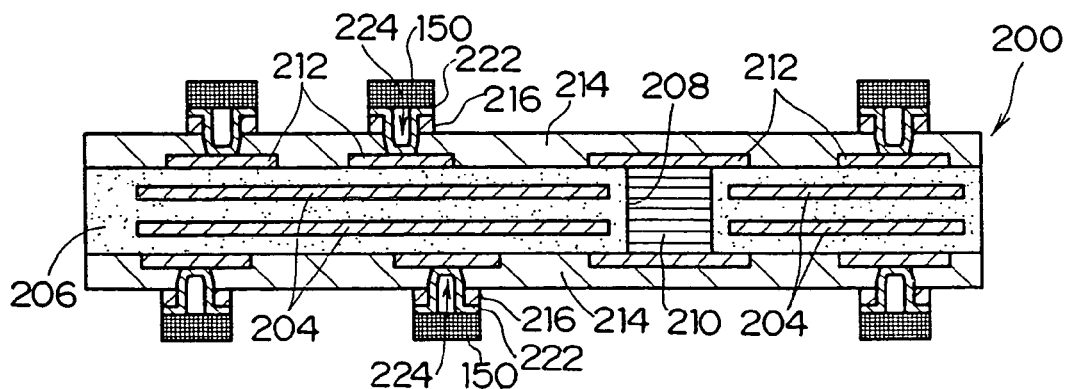
FIG. 18H is a cross sectional view for explaining the manufacture method of the build up wiring board and illustrating a state in which a circuit is formed on the build up layer by etching.
Figure 18I:
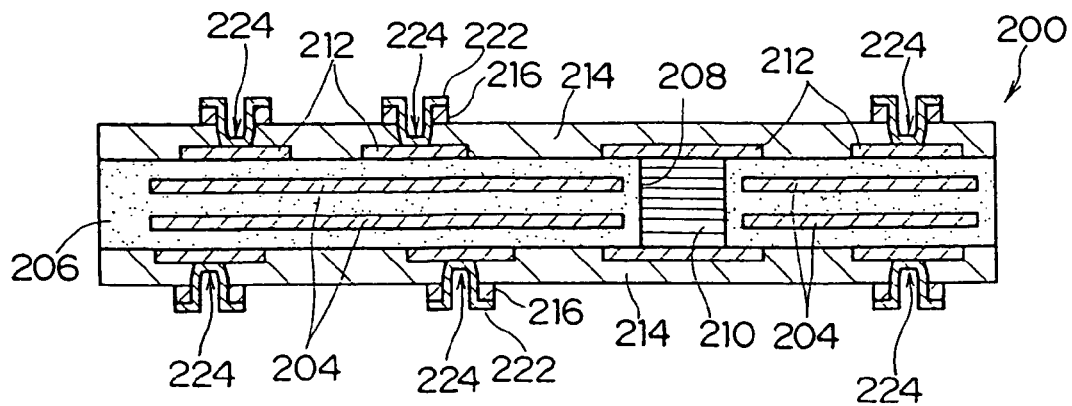
FIG. 18I is a cross sectional view for explaining the manufacture method of the build up wiring board and illustrating the completed build up wiring board.

After the exposure process of the photosensitive material 150 by the exposure device 100 is finished, the build up wiring board 200 in which exposure is completed is detached from the stage 152. As shown in FIG. 18G, the photosensitive material 150 is subject to developing process, and etching mask is formed. As shown in FIG. 18H, the copper foil 216 and the conductor layer 222 are subtractive-etched, and the circuit pattern of the build up layer 218 is formed. Finally, as shown in FIG. 18I, after stripping (removing) the etching mask (photosensitive material 150) left on the circuit pattern, a protecting layer (a solder resist) is coated on the surface of the substrate. Thus, manufacturing of the build up interconnection board 200 is completed.

The build up wiring board of the present embodiment is provided with the build up layers both sides thereon. Accordingly, exposure on the photosensitive material 150 by the exposure device 100 is carried out every each surface. That is, when the exposing on one surface side is finished, the substrate is reversed and the exposing on the other surface side is carried out. However, for the sake of convenience, in FIGS. 18A–18I which are used for explanation of the manufacturing method, the drawings are shown as if the circuits of the surfaces of the build up layers are formed by means of both-sides exposure.

In addition, pitch shifting of the BVH 208 may occur by thermal expansion of the build up wiring board or size irregularity of the build up wiring board. In this case, dimensional (size) change amount of the substrate is obtained from the pitch shift amount determined from the picked up image and the image data of each BVH 208, and, on the basis of the dimensional change amount data, scaling is executed on the image data. As the result, alignment accuracy can be improved.

As discussed above, in the exposure device 100 of the present embodiment, the radioscopic images of the BVHs 208 provided at the core substrate 202 of the build up wiring board 200 are picked up by the X-ray CCD cameras 164A and 164B. On the basis of the position data of the build up wiring board 200 obtained from the image data, the rotation device 184, the stage driving device 186 and the scanner 162 are controlled to be driven by the controller 190, the drive device control section 188 and the scanner control section 192, and a position of the exposure pattern to be exposed on the photosensitive material 150 is aligned. That is, the position of the exposure pattern by which the photosensitive material 150 is exposed with the light beam modulated in accordance with the image data is aligned to a predetermined position determined on the bases of the positions of the alignment marks (BVHs 208). By this, alignment in manufacturing of a laminated structure such as the build up wiring board or the like can be realized. Further, in the present embodiment, the processes from the identification of the alignment mark to the alignment of the exposure are carried out automatically. Accordingly, automation of manufacturing processes can be realized.

In addition, in the present embodiment, the scanner 162 provided with the DMD 50 modulating light beam and the photosensitive material 150 (the build up wiring board 200) are relatively moved in a direction parallel to the surface to be exposed 56 of the photosensitive material 150 by the stage 152 provided with rotation mechanism, and aligning (alignment in the Y direction and the rotating direction) is carried out. Namely, in the present invention, such aligning is carried out by use of mechanical moving meas. Accordingly, the aligning of the exposure pattern is carried out easily.

Further, in the present embodiment, alignment of exposure (alignment in the X direction) is also carried out in such a manner that the modulation timing of the laser light is changed by controlling of the DMD 50 of the scanner 162 on the basis of the control signal generated in the controller 190 in accordance with the image data. That is, alignment of the exposure pattern can be possible by use of the electrical control method that the modulation timing of the laser light is changed. Further, the device structure can be simplified in this case compared to a case in which all alignments are carried out by use of the mechanical control method.

In addition, in the present embodiment, the alignment marks are image-picked up with X-rays by using of the X-ray CCD cameras 164A and 164B in order to identify the alignment marks. As the result, the radioscopic image of the alignment mark can be picked up surely.

The present invention has been explained by the specific embodiment in detail as mentioned above. However, the present invention is not limited to the same. As for the present invention, other various kinds of embodiments are possible in range of the present invention.

For example, in the embodiment mentioned above, the example was described that the exposure device is used for alignment in the manufacturing process of the build up wiring board. However, it can be applied to the build-up (laminating) structure other than the build up wiring board. In addition, regarding the build up wiring board, it is not limited to the structure having one build up layer on each single surface. A plural numbers of the build up layers can be formed on the single surface. Further, regarding the alignment mark, a copper foil pad or a specific shaped pattern or the like can be used instead of the BVH. Even in a case in which the copper foil pad or the specific shaped pattern or the like is used as the alignment mark, the alignment mark provided in the internal layer can be identified by the exposure device of the present invention, alignment of exposure position can be carried out every each build up layer as the external layer.

In addition, in order to reduce the calculation amount of the image data in the controller, the image data is calculated only regarding the X direction, and regarding the Y direction and the rotation direction, the alignment is carried out by means of stage control. However, whether electrical method or mechanical method is used for alignment of each direction can be appropriately selected depending on specification of the device. In addition, in the present embodiment, a device other than the X-rays CCD camera can be used as a device which picks up a radioscopic image of an alignment mark. That is, a device which can pick up an radioscopic image of light of wavelength transmitting through an object to be image-picked up can be used instead of the X-rays CCD camera.

In addition, the exposure head comprising the DMD has been described as the spatial modulation element. However, for example, a spatial modulation element (SLM; a Spatial Light Modulator) of a MEMS (a Micro Electro Mechanical System) type can be used. Further, a liquid crystal light shutter (a FLC) or an optical element (a PLZT element)

modulating a transmitted light by an electro-optic effect, or the like (that is, a spatial modulation element other than the MEMS type) can used. In these cases, a similar effect can be obtained.

In addition, the MEMS is a general term of a minute (micro) system in which micro-size sensor, an actuator and control circuit, in which micro-machine technology based on an IC manufacturing process is applied, are integrated. The spatial modulation element of the MEMS type means a spatial modulation element that is driven by an electric machine operation using static electricity force.

Because the exposure device of the present invention has the structure mentioned above, the aligning of the exposure pattern used in manufacturing of the laminated structure such as the build up wiring board can be realized, and can correspond to the automation of manufacturing process as well.

What is claimed is:

1. An exposure method in which a photosensitive material is exposed with a light beam modulated in accordance with image information, the method comprising:
   reading a radioscopic image of a specific pattern provided on an inner layer of a laminated structure; and
   aligning an exposure position of the photosensitive material laminated on a surface of an outer layer of the laminated structure, on the basis of position information of the read radioscopic image of the specific pattern alone.

2. The exposure method of claim 1, wherein the reading is performed by picking up a radioscopic image using an X-ray irradiated on the laminated structure.

3. The exposure method of claim 1, wherein the laminated structure is a build-up wiring board comprising a core substrate as the inner layer and at least one build-up layer as the outer layer.

4. The exposure method of claim 1, wherein the reading is performed by picking up a radioscopic image using an invisible light irradiated on the laminated structure.

5. The exposure device of claim 4, wherein the invisible light is radiation which can transmit through the laminated structure.

6. The exposure method of claim 1, wherein the aligning is performed by, on the basis of the position information,
   rotating the laminated structure,
   obtaining a shift of the laminated structure in a main scanning direction and adjusting an image data exposure pattern based on the shift, and
   obtaining position data of the laminated structure in a sub scanning direction and controlling the movement of the laminated structure in the sub scanning direction to correspond to an irradiation timing of an exposure beam.

7. An exposure method in which a photosensitive material is exposed with a light beam modulated in accordance with image information, the method comprising:
   reading a radioscopic image of a specific pattern provided on an inner layer of a laminated structure; and
   aligning an exposure position of the photosensitive material laminated on a surface of an outer layer of the laminated structure, on the basis of position information of the read radioscopic image of the specific pattern,
   wherein the aligning is performed by relatively moving a spatial modulating element which modulates the light beam and the laminated structure in a direction parallel to a surface, of the photosensitive material, to be exposed.

8. The exposure method of claim 7, wherein the reading is performed by picking up a radioscopic image using an X-ray irradiated on the laminated structure.

9. The exposure method of claim 7, wherein the laminated structure is a build-up wiring board comprising a core substrate as the inner layer and at least one build-up layer as the outer layer.

10. The exposure method of claim 7, wherein the aligning is performed by, on the basis of the position information,
    rotating the laminated structure,
    obtaining a shift of the laminated structure in a main scanning direction and adjusting an image data exposure pattern based on the shift, and
    obtaining position data of the laminated structure in a sub scanning direction and controlling the movement of the laminated structure in the sub scanning direction to correspond to an irradiation timing of an exposure beam.

11. An exposure method in which a photosensitive material is exposed with a light beam modulated in accordance with image information, the method comprising:
    reading a radioscopic image of a specific pattern provided on an inner layer of a laminated structure; and
    aligning an exposure position of the photosensitive material laminated on a surface of an outer layer of the laminated structure, on the basis of position information of the read radioscopic image of the specific pattern,
    wherein the aligning is performed by controlling a spatial modulating element which modulates the light beam according to a control signal generated in accordance with the image information.

12. The exposure method of claim 11, wherein the reading is performed by picking up a radioscopic image using an X-ray irradiated on the laminated structure.

13. The exposure method of claim 11, wherein the laminated structure is a build-up wiring board comprising a core substrate as the inner layer and at least one build-up layer as the outer layer.

14. The exposure method of claim 11, wherein the aligning is performed by, on the basis of the position information,
    rotating the laminated structure,
    obtaining a shift of the laminated structure in a main scanning direction and adjusting an image data exposure pattern based on the shift, and
    obtaining position data of the laminated structure in a sub scanning direction and controlling the movement of the laminated structure in the sub scanning direction to correspond to an irradiation timing of an exposure beam.

15. An exposure method in which a photosensitive material is exposed with a light beam modulated in accordance with image information, the method comprising:
    reading a radioscopic image of a specific pattern provided on an inner layer of a laminated structure; and
    aligning an exposure position of the photosensitive material laminated on a surface of an outer layer of the laminated structure, on the basis of position information of the read radioscopic image of the specific pattern,
    wherein the aligning is performed by relatively moving a spatial modulating element which modulates the light beam and the laminated structure in a direction parallel to a surface, of the photosensitive material, to be exposed and controlling the spatial modulating element according to a control signal generated in accordance with the image information.

16. The exposure method of claim 15, wherein the exposure position of the photosensitive material is aligned by relatively moving the spatial modulating element and the laminated structure in at least one direction selected from among a main scanning direction, a sub scanning direction and a rotation direction, and the exposure position of the photosensitive material is aligned by controlling the spatial modulating element in the remaining direction among the main scanning direction, the sub scanning direction and the rotation direction.

17. The exposure method of claim 15, wherein the aligning is performed by, on the basis of the position information,
rotating the laminated structure,
obtaining a shift of the laminated structure in a main scanning direction and adjusting an image data exposure pattern based on the shift, and
obtaining position data of the laminated structure in a sub scanning direction and controlling the movement of the laminated structure in the sub scanning direction to correspond to an irradiation timing of an exposure beam.

18. An exposure method in which a photosensitive material is exposed with a light beam modulated in accordance with image information, the method comprising:
reading a radioscopic image of a specific pattern provided on an inner layer of a laminated structure; and
aligning an exposure position of the photosensitive material laminated on a surface of an outer layer of the laminated structure, on the basis of position information of the read radioscopic image of the specific pattern,
wherein the exposure position of the photosensitive material is aligned after adjusting the image information.

19. An exposure method according to claim 18, wherein the image information is adjusted such that scaling is executed on the image information on the basis of dimensional change amount of the laminated structure, which is obtained from the position information of the read radioscopic image of the specific pattern.

20. An exposure method according to claim 18, wherein the image information is adjusted such that at least one of parallel moving, scaling and rotating is executed on the image information.

21. An exposure method in which a photosensitive material is exposed with a light beam modulated in accordance with image information, the method comprising:
reading a radioscopic image of a specific pattern provided on an inner layer of a laminated structure;
aligning an exposure position of the photosensitive material laminated on a surface of an outer layer of the laminated structure, on the basis of position information of the read radioscopic image of the specific pattern;
scanning the light beam mechanically so as to relatively move the laminated structure parallel to a surface, of the photosensitive material, to be exposed of the photosensitive material; and
scanning the light beam electrically so as to control the light beam according to a control signal generated in accordance with the image information,
wherein the exposure position of the photosensitive material is aligned such that alignment is carried out by the mechanical scanning in a scanning direction thereof and by the electrical scanning in a direction perpendicular to the scanning direction of the mechanical scanning.

22. An exposure method in which a photosensitive material is exposed with a light beam modulated in accordance with image information, the method comprising:
reading a radioscopic image of a specific pattern provided on an inner layer of a laminated structure;
aligning an exposure position of the photosensitive material laminated on a surface of an outer layer of the laminated structure, on the basis of position information of the read radioscopic image of the specific pattern; and
modulating the light beam by a spatial modulating element,
wherein the radioscopic image of the specific pattern is obtained by directly reading radioscopic light.

* * * * *